US012740056B2

(12) United States Patent
Chen et al.

(10) Patent No.: US 12,740,056 B2
(45) Date of Patent: Sep. 15, 2026

(54) ONE TIME PROGRAMMING MEMORY CELL WITH GATE-ALL-AROUND TRANSISTOR FOR PHYSICALLY UNCLONABLE FUNCTION TECHNOLOGY

(71) Applicant: eMemory Technology Inc., Hsin-Chu (TW)

(72) Inventors: Lun-Chun Chen, Hsinchu County (TW); Ping-Lung Ho, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 481 days.

(21) Appl. No.: 18/219,263

(22) Filed: Jul. 7, 2023

(65) Prior Publication Data

US 2024/0023328 A1 Jan. 18, 2024

Related U.S. Application Data

(60) Provisional application No. 63/388,258, filed on Jul. 12, 2022.

(51) Int. Cl.
*H10B 20/25* (2023.01)
*G11C 16/24* (2006.01)
(Continued)

(52) U.S. Cl.
CPC ............. *H10B 20/25* (2023.02); *G11C 16/24* (2013.01); *G11C 16/26* (2013.01); *G11C 17/16* (2013.01); *H02H 9/02* (2013.01); *H10W 42/405* (2026.01)

(58) Field of Classification Search
CPC ........ H10B 20/25; G11C 16/24; G11C 16/26; G11C 17/16; G11C 16/10; H02H 9/02;
(Continued)

(56) References Cited

U.S. PATENT DOCUMENTS 9,589,970 B1 * 3/2017 Tseng .................. H10D 62/116
9,613,714 B1 * 4/2017 Wong .................... G11C 17/16
(Continued)

FOREIGN PATENT DOCUMENTS

CA 2952941 A1 7/2017
EP 3196888 B1 12/2019

OTHER PUBLICATIONS

Office Action issued by Taiwan Intellectual Property Office on Dec. 22, 2023.

*Primary Examiner* — S M Sohel Imtiaz
(74) *Attorney, Agent, or Firm* — WPAT, PC

(57) ABSTRACT

An antifuse-type OTP memory cell at least includes a first nanowire, a second nanowire, a first gate structure, a first drain/source structure and a second drain/source structure. The first gate structure includes a first gate dielectric layer, a second gate dielectric layer and a first gate layer. The first nanowire is surrounded by the first gate dielectric layer. The second nanowire is surrounded by the second gate dielectric layer. The first gate dielectric layer and the second gate dielectric layer are surrounded by the first gate layer. The first drain/source structure is electrically contacted with a first terminal of the first nanowire and a first terminal of the second nanowire. The second drain/source structure is electrically contacted with a second terminal of the first nanowire. The second drain/source structure is not electrically contacted with a second terminal of the second nanowire.

12 Claims, 18 Drawing Sheets

(51) Int. Cl.

| | |
|---|---|
| ***G11C 16/26*** | (2006.01) |
| ***G11C 17/16*** | (2006.01) |
| ***H02H 9/02*** | (2006.01) |
| ***H10W 42/40*** | (2026.01) |

(58) Field of Classification Search
CPC ... H02H 9/046; H10W 42/405; H10D 89/611; H10D 89/811
See application file for complete search history.

(56) References Cited

U.S. PATENT DOCUMENTS

| | | | | |
|---|---|---|---|---|
| 2015/0214732 | A1* | 7/2015 | Haruki | H02H 9/042 361/56 |
| 2015/0333078 | A1* | 11/2015 | Colinge | H10D 30/689 438/257 |
| 2017/0053925 | A1* | 2/2017 | Wong | G11C 17/16 |
| 2019/0164981 | A1* | 5/2019 | Chen | G11C 11/5621 |
| 2021/0249422 | A1* | 8/2021 | Chang | G06F 30/392 |
| 2021/0249423 | A1* | 8/2021 | Chang | H10D 84/834 |
| 2021/0320190 | A1* | 10/2021 | Cheng | H10D 84/038 |
| 2022/0359545 | A1* | 11/2022 | Chang | H10D 62/118 |
| 2023/0064751 | A1* | 3/2023 | Chang | G11C 17/16 |

* cited by examiner

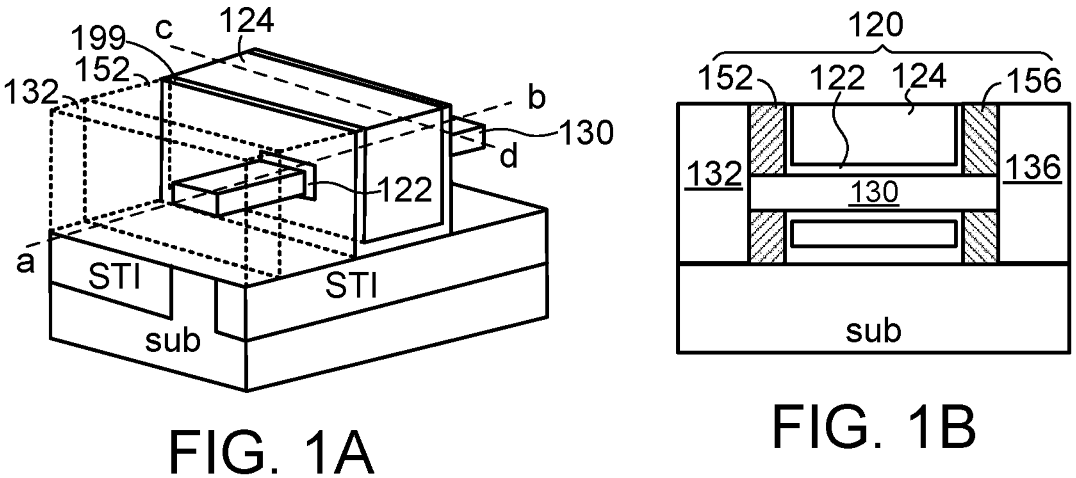
FIG. 1A
FIG. 1B
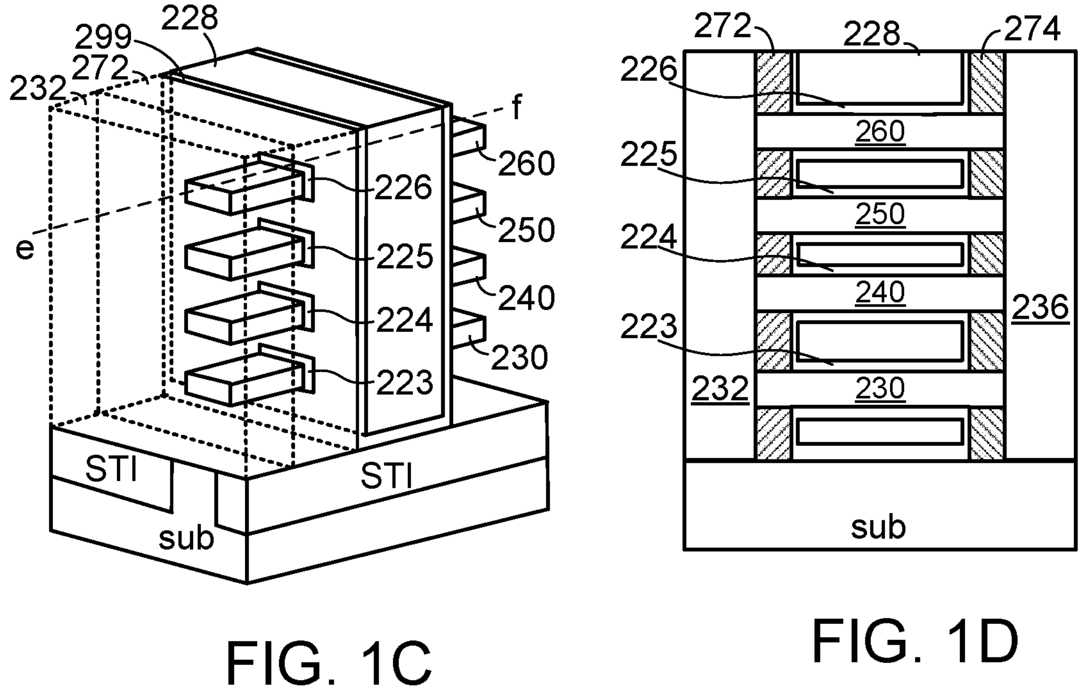
FIG. 1C
FIG. 1D

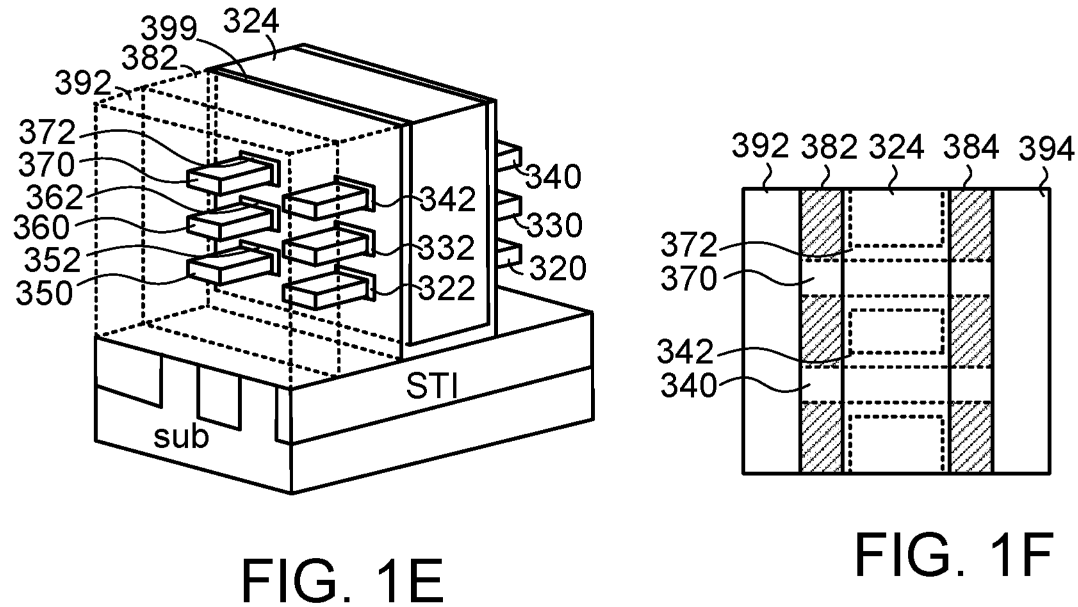
FIG. 1E
FIG. 1F
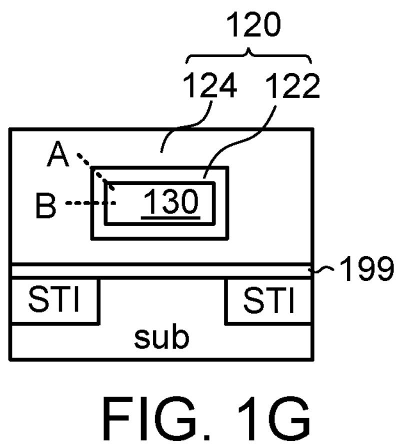
FIG. 1G (floating) $BL_2$ (floating) $WL_2$ ($V_{ENRL}$) AF ($V_{ON}$) $WL_1$ (0V) $BL_1$ 479 489 481 488 469 461 468 429 439 431 438 427

486 466 $I_{ENRL}$ 476 456 484 464 474 454 482 459 462 472 452 480 460 470 450 sub $M_{GAA\_sel2}$ $M_{GAA\_AF}$ $M_{GAA\_sel1}$

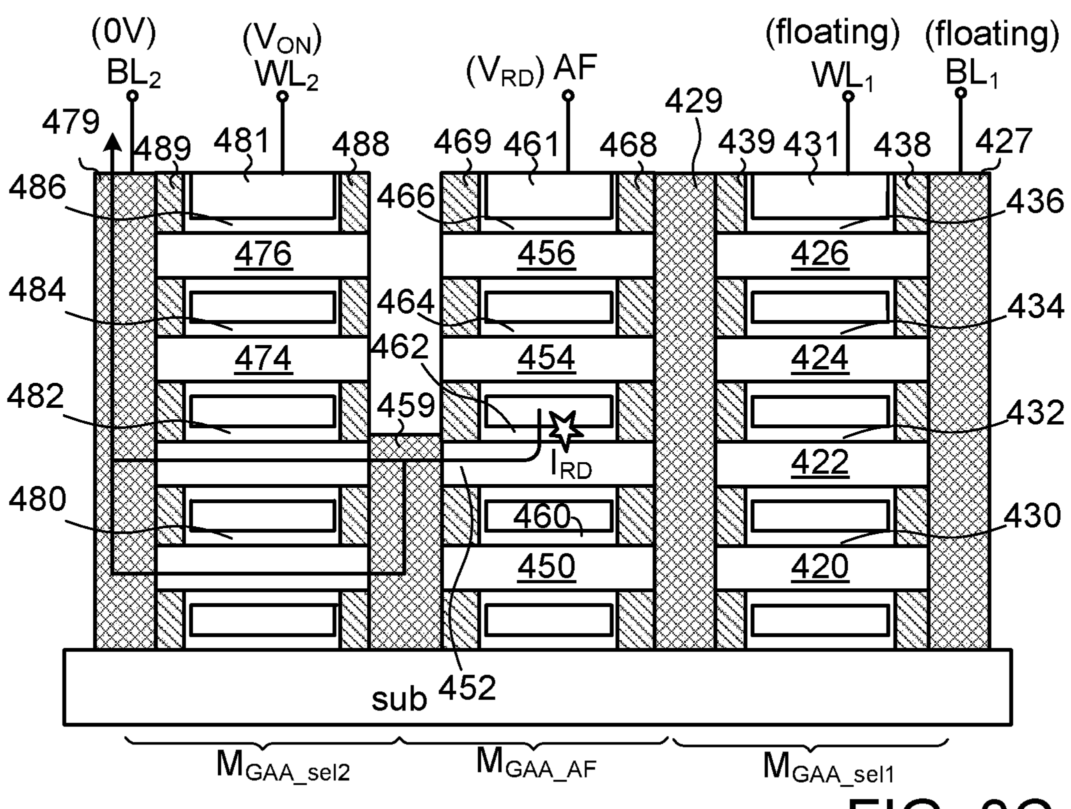
FIG. 3C
FIG. 3D
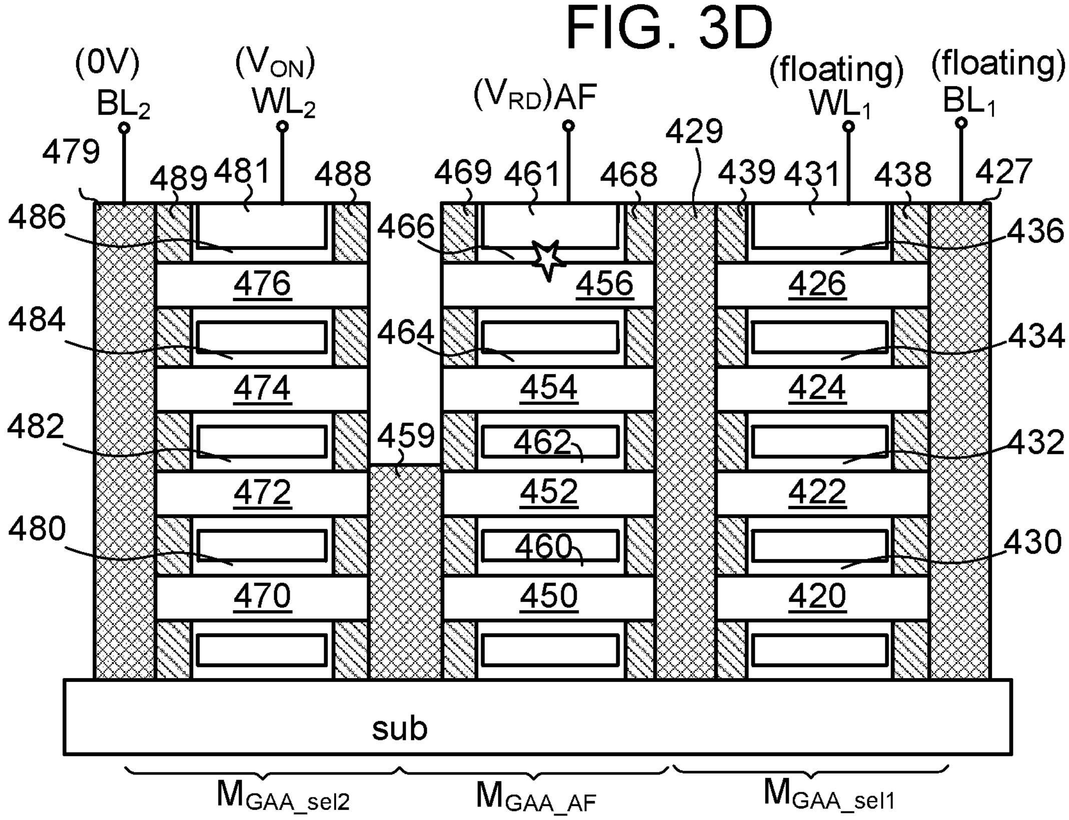

(0V) BL3
(VON) WL2
(VRD) AF
(floating) WL1
(floating) BL1
IRD2
489 481 488 457 469 461 468 429 439 431 438 427
486 466 456 426 436
484 464 454 424 434
477
479 459 462 432
482 472 452 422
480 460 430
IRD1 470 450 420
BL2 (0V)
sub
MGAA_sel2 MGAA_AF MGAA_sel1

ONE TIME PROGRAMMING MEMORY CELL WITH GATE-ALL-AROUND TRANSISTOR FOR PHYSICALLY UNCLONABLE FUNCTION TECHNOLOGY

TECHNOLOGY

This application claims the benefit of U.S. provisional application Ser. No. 63/388,258, filed Jul. 12, 2022, the subject matters of which are incorporated herein by references.

FIELD OF THE INVENTION

The present invention relates to a memory cell of a non-volatile memory, and more particularly to a one time programming memory cell with a gate-all-around (GAA) transistor for a physically unclonable function (PUF) technology.

BACKGROUND OF THE INVENTION

As is well known, a one time programming memory (also referred as an OTP memory) is one of the non-volatile memories. The OTP memory comprises plural one time programming memory cells (also referred as OTP memory cells). The OTP memory cell can be programmed once. After the OTP memory cell is programmed, the stored data fails to be modified.

A physically unclonable function (PUF) technology is a novel method for protecting the data of a semiconductor chip. That is, the use of the PUF technology can prevent the data of the semiconductor chip from being stolen. In accordance with the PUF technology, the semiconductor chip is capable of providing a random code. This random code is used as a unique identity code (ID code) of the semiconductor chip to achieve the protecting function.

Generally, the PUF technology acquires the unique random code of the semiconductor chip according to the manufacturing variation of the semiconductor chip. This manufacturing variation includes the semiconductor process variation. That is, even if the PUF semiconductor chip is produced by a precise manufacturing process, the random code cannot be duplicated. Consequently, the semiconductor chip for the PUF technology is suitably used in the applications with high security requirements.

For example, U.S. Pat. No. 9,613,714 disclosed a one time programming memory cell and a memory array for a PUF technology and an associated random code generating method.

SUMMARY OF THE INVENTION

An embodiment of the present invention provides an antifuse-type one time programming (OTP) memory cell for a physically unclonable function technology. The antifuse-type OTP memory cell includes a first nanowire, a second nanowire, a first gate structure, a first drain/source structure, a second drain/source structure, a first transistor and a second transistor. The first gate structure includes a first spacer, a second spacer, a first gate dielectric layer, a second gate dielectric layer and a first gate layer. A central region of the first nanowire is surrounded by the first gate dielectric layer. A central region of the second nanowire is surrounded by the second gate dielectric layer. The first gate dielectric layer and the second gate dielectric layer are surrounded by the first gate layer. The first gate layer is connected with an antifuse control line. A first side region of the first nanowire is surrounded by the first spacer. A second side region of the first nanowire is surrounded by the second spacer. A first side region of the second nanowire is surrounded by the first spacer. A second side region of the second nanowire is surrounded by the second spacer. The first drain/source structure is electrically contacted with a first terminal of the first nanowire and a first terminal of the second nanowire. The second drain/source structure is electrically contacted with a second terminal of the first nanowire. The second drain/source structure is not electrically contacted with a second terminal of the second nanowire. The first transistor includes a first drain/source terminal, a gate terminal and a second drain/source terminal. The second drain/source terminal of the first transistor is connected with the first drain/source structure. The second transistor includes a first drain/source terminal, a gate terminal and a second drain/source terminal. The first drain/source terminal of the second transistor is connected with the second drain/source structure.

Another embodiment of the present invention provides an antifuse-type one time programming (OTP) memory cell for a physically unclonable function technology. The antifuse-type OTP memory cell includes a first nanowire, a first gate structure, a first drain/source structure, a second nanowire, a second gate structure, a second drain/source structure, a third drain/source structure, a first transistor and a second transistor. The first gate structure includes a first spacer, a second spacer, a first gate dielectric layer and a first gate layer. A central region of the first nanowire is surrounded by the first gate dielectric layer. The first gate dielectric layer is surrounded by the first gate layer. The first gate layer is connected with an antifuse control line. A first side region of the first nanowire is surrounded by the first spacer. A second side region of the first nanowire is surrounded by the second spacer. The first drain/source structure is electrically contacted with a first terminal of the first nanowire. The second gate structure comprising a third spacer, a fourth spacer, a second gate dielectric layer and a second gate layer. A central region of the second nanowire is surrounded by the second gate dielectric layer. The second gate dielectric layer is surrounded by the second gate layer. The second gate layer is connected with the antifuse control line. A first side region of the second nanowire is surrounded by the third spacer. A second side region of the second nanowire is surrounded by the fourth spacer. The second drain/source structure is electrically contacted with a second terminal of the first nanowire and a first terminal of the second nanowire. The third drain/source structure is electrically contacted with a second terminal of the second nanowire. The first transistor includes a first drain/source terminal, a gate terminal and a second drain/source terminal. The second drain/source terminal of the first transistor is connected with the first drain/source structure. The second transistor includes a first drain/source terminal, a gate terminal and a second drain/source terminal. The first drain/source terminal of the second transistor is connected with the third drain/source structure.

Another embodiment of the present invention provides an antifuse-type one time programming (OTP) memory cell for a physically unclonable function technology. The antifuse-type OTP memory cell includes a first nanowire, a second nanowire, a first gate structure, a first drain/source structure, a third nanowire, a fourth nanowire, a second gate structure, a first transistor and a second transistor. The first gate structure includes a first spacer, a second spacer, a first gate dielectric layer, a second gate dielectric layer and a first gate layer. A central region of the first nanowire is surrounded by the first gate dielectric layer. A central region of the second nanowire is surrounded by the second gate dielectric layer. The first gate dielectric layer and the second gate dielectric layer are surrounded by the first gate layer. The first gate layer is connected with an antifuse control line. A first side region of the first nanowire is surrounded by the first spacer. A second side region of the first nanowire is surrounded by the second spacer. A first side region of the second nanowire is surrounded by the first spacer. A second side region of the second nanowire is surrounded by the second spacer. The first drain/source structure is electrically contacted with a first terminal of the first nanowire. The first drain/source structure is not electrically contacted with a first terminal of the second nanowire. A first terminal of the third nanowire is electrically contacted with a second terminal of the first nanowire. A first terminal of the fourth nanowire is electrically contacted with a second terminal of the second nanowire. The second gate structure includes a third spacer, a fourth spacer, a third gate dielectric layer, a fourth gate dielectric layer and a second gate layer. A central region of the third nanowire is surrounded by the third gate dielectric layer. A central region of the fourth nanowire is surrounded by the fourth gate dielectric layer. The third gate dielectric layer and the fourth gate dielectric layer are surrounded by the second gate layer. A first side region of the third nanowire is surrounded by the third spacer. A second side region of the third nanowire is surrounded by the fourth spacer. A first side region of the fourth nanowire is surrounded by the third spacer. A second side region of the fourth nanowire is surrounded by the fourth spacer. The second drain/source structure is electrically contacted with a second terminal of the third nanowire and a second terminal of the fourth nanowire. The second drain/source structure, the third nanowire, the fourth nanowire and the second gate structure are collaboratively formed as a first transistor. The second transistor includes a first drain/source terminal, a gate terminal and a second drain/source terminal. The first drain/source terminal of the second transistor is connected with the first drain/source structure.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1A is a schematic perspective view illustrating the structure of a GAA transistor with one nanowire;

FIG. 1B is a schematic cross-sectional view illustrating the GAA transistor as shown in FIG. 1A and taken along the line a-b;

FIG. 1C is a schematic perspective view illustrating the structure of a GAA transistor with four nanowires;

FIG. 1D is a schematic cross-sectional view illustrating the GAA transistor as shown in FIG. 1C and taken along the line e-f, FIG. 1E is a schematic perspective view illustrating the structure of another GAA transistor with six nanowires;

FIG. 1F is a schematic top view illustrating the GAA transistor as shown in FIG. 1E;

FIG. 1G is a schematic cross-sectional view illustrating the GAA transistor as shown in FIG. 1A and taken along the line c-d;

FIG. 3C and FIG. 3D schematically illustrate associated bias voltages for performing a read action on the antifuse-type OTP memory cell according to the first embodiment of the present invention;

DETAILED DESCRIPTION OF PREFERRED EMBODIMENTS

Figure 2:
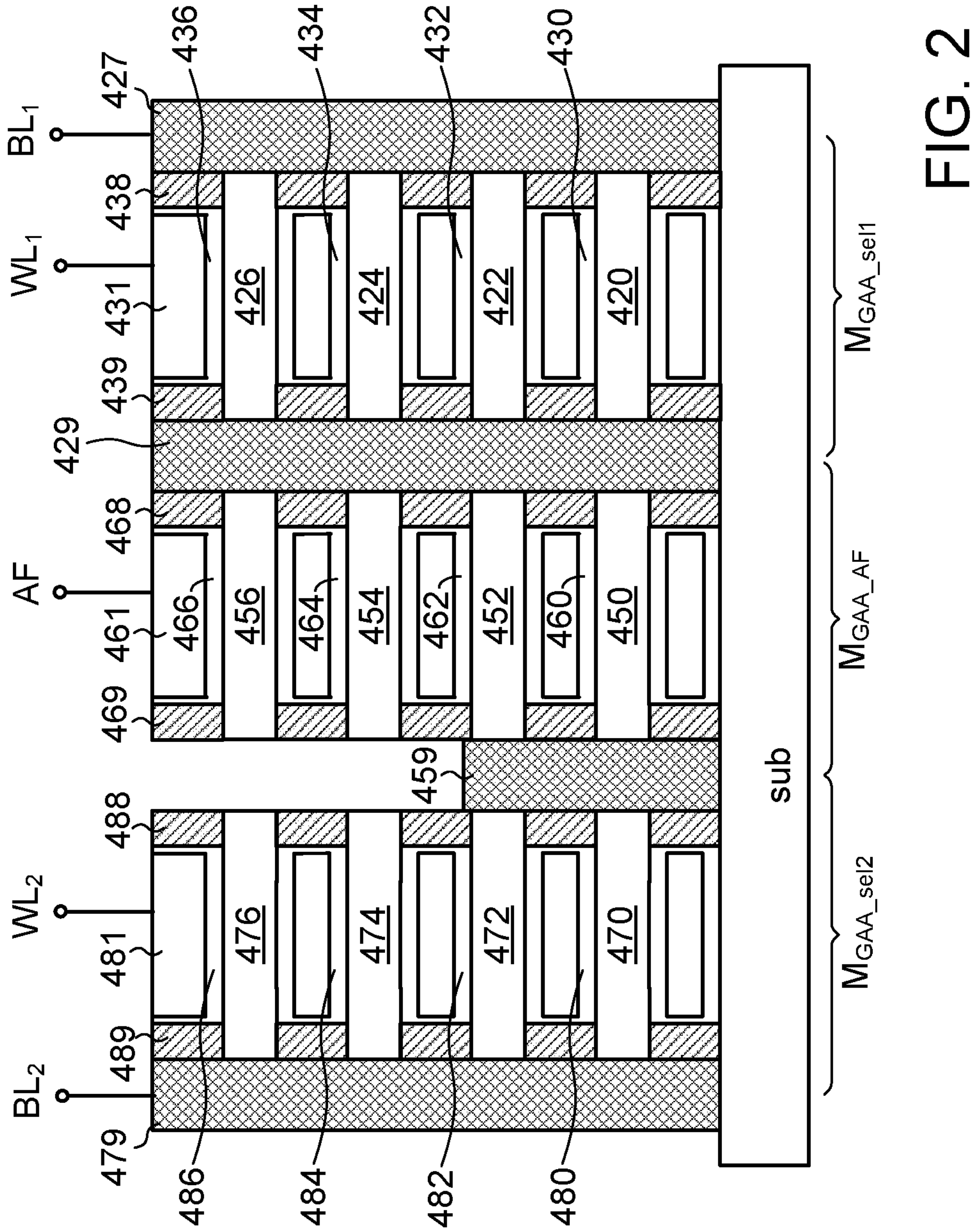
FIG. 2 is a schematic cross-sectional view illustrating the structure of an antifuse-type one time programming memory cell for a PUF technology according to a first embodiment of the present invention.

The present invention provides a one time programming memory cell with a gate-all-around (GAA) transistor for a physically unclonable function (PUF) technology. As used herein, the term "ruptured" may be referred to as "quantum-tunneling" technique. In detail, after energy accumulated on the gate terminals of a GAA transistors reaches a certain level, quantum-tunneling may occur on the GAA transistor. The energy accumulated on the gate terminals of the GAA transistor will be released via a gate leakage path of which undergoing quantum-tunneling. Thus, GAA transistors would generate a quantum-tunneling current higher than a predetermined threshold value. The mechanism of quantum-tunneling mentioned above may be similar to a gate oxide breakdown, but is not limited to a hard/destructive breakdown. For example, the quantum-tunneling may be a soft breakdown that leverages trap-assisted tunneling, but the present invention is not limited thereto. For better comprehension, the GAA transistor which generates a quantum-tunneling current higher than the predetermined threshold value may be referred to as being "ruptured", and the GAA transistor which generates a quantum-tunneling current lower than the predetermined threshold value (or does not undergo the quantum-tunneling) may be referred to as being "unruptured".

FIG. 1A is a schematic perspective view illustrating the structure of a GAA transistor with one nanowire. FIG. 1B is a schematic cross-sectional view illustrating the GAA transistor as shown in FIG. 1A and taken along the line a-b.

As shown in FIG. 1A, 1C, 1E and FIG. 1G, an isolation material STI is formed in a semiconductor substrate sub. A gate structure 120 is formed over the semiconductor substrate sub. A nanowire 130 is penetrated through the gate structure 120. That is, the nanowire 130 is surrounded and supported by the gate structure 120. For example, the nanowire 130 is a rectangular nanowire or a cylindrical nanowire. Furthermore, two drain/source structures 132 and 136 are electrically contacted with the nanowire 130. According to the embodiment of the invention, the two drain/source structures 132 and 136, the gate structure 120 and nanowire 130 are collaboratively formed as a GAA transistor.

As shown in FIG. 1A and FIG. 1B, the gate structure 120 comprises spacers 152 and 156, a gate dielectric structures 199 and a gate layer 124. The gate dielectric structure 199 is contacted between a first sidewall of the spacer 152 and a first sidewall of the gate layer 124. Also, the gate dielectric structure 199 is contacted between a first sidewall of the spacer 156 and a second sidewall of the gate layer 124. Furthermore, the gate dielectric structure 199 is contacted between the surface of the semiconductor substrate sub and a bottom surface of the gate layer 124, so as to electrically isolate the semiconductor substrate sub from the gate layer 124. Moreover, the gate dielectric structure 199 includes the gate dielectric layer 122. Actually, the gate dielectric structure 199 may only include the gate dielectric layer 122. That is to say, the gate structure 120 at least includes two spacers 152, 156, the gate dielectric layer 122 and a gate layer 124, and the gate layer 124 is electrically isolated from the semiconductor substrate sub.

As shown in FIG. 1B, the gate dielectric layer 122 surrounds the central region of the nanowire 130. The gate layer 124 surrounds the gate dielectric layer 122. The first side region of the nanowire 130 is surrounded by the spacer 152. The second side region of the nanowire 130 is surrounded by the spacer 156. Moreover, the spacers 152 and 156 are formed on the semiconductor substrate sub. The nanowire 130 that is surrounded by the gate structure 120 is a nanowire channel region of a GAA transistor. The two drain/source structures 132 and 136 are formed over the substrate sub. Moreover, the two drain/source structures 132 and 136 are respectively located on both sides of the gate structure 120. The drain/source structure 132 is electrically contacted with a first terminal of the nanowire 130, and the drain/source structure 136 is electrically contacted with a second terminal of the nanowire 130. In an embodiment, the drain/source structure 132, the drain/source structure 136 and the nanowire 130 may have the same dopant type. For example, the drain/source structure 132, the drain/source structure 136 and the nanowire 130 are n-type doped regions or p-type doped regions.

As shown in FIG. 1B, the GAA transistor comprises the gate structure 120, the nanowire 130, the drain/source structure 132 and the drain/source structure 136. The nanowire 130 is served as the nanowire channel region of the GAA transistor.

It is noted that the number of nanowires in the GAA transistor is not restricted. For example, the GAA transistor comprises plural nanowires. FIG. 10 is a schematic perspective view illustrating the structure of a GAA transistor with four nanowires. FIG. 1D is a schematic cross-sectional view illustrating the GAA transistor as shown in FIG. 1C and taken along the line e-f.

As shown in FIG. 10 and FIG. 1D, a gate structure is formed over the semiconductor substrate sub. Moreover, plural nanowires 230, 240, 250 and 260 are penetrated through the gate structure. That is, the nanowires 230, 240, 250 and 260 are surrounded and supported by the gate structure. For example, the nanowires 230, 240, 250 and 260 are rectangular nanowires or cylindrical nanowires. Furthermore, two drain/source structures 232 and 236 are electrically contacted with the nanowires 230, 240, 250 and 260. According to the embodiment of the invention, the two drain/source structures 232 and 236, the gate structure and the nanowires 230, 240, 250 and 260 are collaboratively formed as a GAA transistor.

As shown in FIG. 10 and FIG. 1D, the gate structure comprises spacers 272 and 274, gate dielectric structures 299 and 226 and a gate layer 228. The gate dielectric structure 299 is contacted between a first sidewall of the spacer 272 and a first sidewall of the gate layer 228. Also, the gate dielectric structure 299 is contacted between a first sidewall of the spacer 274 and a second sidewall of the gate layer 228. Furthermore, the gate dielectric structure 299 is contacted between the surface of the semiconductor substrate sub and a bottom surface of the gate layer 229, so as to electrically isolate the semiconductor substrate sub from the gate layer 229. Moreover, the gate dielectric structure 299 includes the gate dielectric layer 223, 224, 225, 226. That is to say, the gate structure at least includes two spacers 272, 274, the gate dielectric layer 223, 224, 225, 226 and a gate layer 228, and the gate layer 228 is electrically isolated from the semiconductor substrate sub.

As shown in FIG. 1D, the gate dielectric layer 223 surrounds the central region of the nanowire 230. The gate dielectric layer 224 surrounds the central region of the nanowire 240. The gate dielectric layer 225 surrounds the central region of the nanowire 250. The gate dielectric layer 226 surrounds the central region of the nanowire 260. Moreover, the gate layer 228 surrounds the gate dielectric layers 223, 224, 225 and 226. The first side regions of the nanowires 230, 240, 250 and 260 are surrounded by the spacer 272. The second side regions of the nanowires 230, 240, 250 and 260 are surrounded by the spacer 274. Moreover, the spacers 272 and 274 are formed on the semiconductor substrate sub. The nanowires 230, 240, 250 and 260 that are surrounded by the gate structure are nanowire channel regions of the GAA transistor. Moreover, the two drain/source structures 232 and 236 are respectively located on both sides of the gate structure. The drain/source structure 232 is electrically contacted with the first terminals of the nanowires 230, 240, 250 and 260. The drain/source structure 236 is electrically contacted with the second terminals of the nanowires 230, 240, 250 and 260. In an embodiment, the drain/source structure 232, the drain/source structure 236 and the nanowires 230, 240, 250 and 260 may have the same dopant type. For example, the drain/source structure 232, the drain/source structure 236 and the nanowires 230, 240, 250 and 260 are n-type doped regions or p-type doped regions.

As shown in FIG. 1D, the GAA transistor comprises the gate structure, the nanowires 230, 240, 250 and 260, the drain/source structure 232 and the drain/source structure 236. The nanowires 230, 240, 250 and 260 are served as the nanowire channel regions of the GAA transistor.

As shown in 1C, the four nanowires 230, 240, 250 and 260 in the GAA transistor are vertically arranged along a line that is perpendicular to a surface of the substrate sub. It is noted that the arrangement of the nanowires in the GAA transistor is not restricted.

FIG. 1E is a schematic perspective view illustrating the structure of another GAA transistor with six nanowires. FIG. 1F is a schematic top view illustrating the GAA transistor as shown in FIG. 1E. As shown in FIG. 1E, six nanowires 320, 330, 340, 350, 360 and 370 in the GAA transistor are vertically arranged along two lines that are perpendicular to a surface of the substrate sub. The nanowires 320, 330 and 340 are arranged along the first line. The nanowires 350, 360 and 370 are arranged along the second line. It is noted that the nanowires in the GAA transistor may be arranged along more than two lines. Moreover, the number of nanowires in each line is not restricted.

As shown in FIG. 1E and FIG. 1F, a gate structure is formed over the semiconductor substrate sub. Moreover, the six nanowires 320, 330, 340, 350, 360 and 370 are penetrated through the gate structure. The six nanowires 320, 330, 340, 350, 360 and 370 are vertically arranged along two lines. The three nanowires 320, 330 and 340 are arranged along the first line. The three nanowires 350, 360 and 370 are arranged along the second line. Also, the two nanowires 370 and 340 are horizontally arranged in a direction parallel to the surface of the substrate sub. Moreover, the nanowires 320, 330, 340, 350, 360 and 370 are surrounded and supported by the gate structure. For example, the nanowires 320, 330, 340, 350, 360 and 370 are rectangular nanowires or cylindrical nanowires. Furthermore, two drain/source structures 392 and 394 are electrically contacted with the nanowires 320, 330, 340, 350, 360 and 370. According to the embodiment of the invention, the two drain/source structures 392 and 394, the gate structure and the nanowires 320, 330, 340, 350, 360 and 370 are collaboratively formed as the GAA transistor.

As shown in FIG. 1E and FIG. 1F, the gate structure comprises spacers 382 and 384, gate dielectric structures 399 and a gate layer 324. The gate dielectric structure 299 is contacted between a first sidewall of the spacer 382 and a first sidewall of the gate layer 324. Also, the gate dielectric structure 399 is contacted between a first sidewall of the spacer 384 and a second sidewall of the gate layer 324.

Furthermore, the gate dielectric structure 399 is contacted between the surface of the semiconductor substrate sub and a bottom surface of the gate layer 324, so as to electrically isolate the semiconductor substrate sub from the gate layer 324. Moreover, the gate dielectric structure 399 includes the gate dielectric layer 322, 332, 342, 352, 362, 372. That is to say, the gate structure at least includes two spacers 382, 384, the gate dielectric layer 322, 332, 342, 352, 362, 372 and a gate layer 324, and the gate layer 324 is electrically isolated from the semiconductor substrate sub.

As shown in FIG. 1F, the gate dielectric layer 322 surrounds the central region of the nanowire 320. The gate dielectric layer 332 surrounds the central region of the nanowire 330. The gate dielectric layer 342 surrounds the central region of the nanowire 340. The gate dielectric layer 352 surrounds the central region of the nanowire 350. The gate dielectric layer 362 surrounds the central region of the nanowire 360. The gate dielectric layer 372 surrounds the central region of the nanowire 370. Moreover, the gate layer 324 surrounds the gate dielectric layers 322, 332, 342, 352, 362 and 372. The first side regions of the nanowires 320, 330, 340, 350, 360 and 370 are surrounded by the spacer 382. The second side regions of the nanowires 320, 330, 340, 350, 360 and 370 are surrounded by the spacer 384. Moreover, the spacers 382 and 384 are formed on the semiconductor substrate sub. The nanowires 320, 330, 340, 350, 360 and 370 that are surrounded by the gate structure are nanowire channel regions of the GAA transistor. Moreover, the two drain/source structures 392 and 394 are respectively located on both sides of the gate structure. The drain/source structure 292 is electrically contacted with the first terminals of the nanowires 320, 330, 340, 350, 360 and 370. The drain/source structure 394 is electrically contacted with the second terminals of the nanowires 320, 330, 340, 350, 360 and 370. In an embodiment, the drain/source structure 392, the drain/source structure 394 and the nanowires 320, 330, 340, 350, 360 and 370 may have the same dopant type. For example, the drain/source structure 392, the drain/source structure 394 and the nanowires 320, 330, 340, 350, 360 and 370 are n-type doped regions or p-type doped regions.

As shown in FIG. 1E and FIG. 1F, the GAA transistor comprises the gate structure, the nanowires 320, 330, 340, 350, 360 and 370, the drain/source structure 392 and the drain/source structure 394. The nanowires 320, 330, 340, 350, 360 and 370 are served as the nanowire channel regions of the GAA transistor.

Moreover, the nanowires 130, 230, 240, 250, 260, 320, 330, 340, 350, 360 and 370 as shown in FIG. 1A, FIG. 10 and FIG. 1E can also be referred as nanosheets.

FIG. 1G is a schematic cross-sectional view illustrating the GAA transistor as shown in FIG. 1A and taken along the line c-d. As shown in FIG. 1G, the nanowire is a rectangular nanowire. The nanowire 130 is surrounded by the gate structure 120. The thickness of the gate dielectric layer 122 is about 0.02 μm. For example, in a case that a voltage difference between the gate layer 124 and the nanowire 130 is 6V and the electric field (E) at the positions near the flat surface B of the gate dielectric layer 122 is uniformly distributed (e.g., about 10 MV/cm). Moreover, as the depth of the gate dielectric layer 122 increases, the electric field (E) at the positions near the corner region A of the gate dielectric layer 122 gradually increases. Moreover, the electric field (E) at the junction between the gate dielectric layer 122 and the nanowire 130 is the largest (e.g., 19 MV/cm). That is, if there is a specified high voltage difference between the gate dielectric layer 122 and the nanowire 130, the electric field (E) at the junction between the gate dielectric layer 122 and the nanowire 130 is the largest. As a consequence, the gate dielectric layer 122 is ruptured at the corner region A. Due to the above characteristics, a novel antifuse-type one time programming memory cell with the GAA transistor can be designed. Moreover, the antifuse-type one time programming memory cell can be designed according to the concepts of the PUF technology. For succinctness, the antifuse-type one time programming memory cell is also referred to as an antifuse-type OTP memory cell.

FIG. 2 is a schematic cross-sectional view illustrating the structure of an antifuse-type one time programming memory cell for a PUF technology according to a first embodiment of the present invention. In this embodiment, the OTP memory cell comprises three GAA transistors. The structure of each of the three GAA transistors is similar to that of FIG. 10, and not redundantly described herein. The three GAA transistors include a first select transistor $M_{GAA\_sel1}$, a second select transistor $M_{GAA\_sel2}$ and an antifuse transistor $M_{GAA\_AF}$. The first select transistor $M_{GAA\_sel1}$, the second select transistor $M_{GAA\_sel2}$ and the antifuse transistor $M_{GAA\_AF}$ are formed over the semiconductor substrate sub.

The first select transistor $M_{GAA\_sel1}$ comprises a drain/source structure 427, a drain/source structure 429, a gate structure and four nanowires 420, 422, 424 and 426. The gate structure is formed over the semiconductor sub. The gate structure comprises two spacers 438, 439, gate dielectric layers 430, 432, 434, 436 and a gate layer 431. The gate dielectric layer 430 surrounds the central region of the nanowire 420. The gate dielectric layer 432 surrounds the central region of the nanowire 422. The gate dielectric layer 434 surrounds the central region of the nanowire 424. The gate dielectric layer 436 surrounds the central region of the nanowire 426. The gate layer 431 surrounds the gate dielectric layers 430, 432, 434 and 436. The first side regions of the nanowires 420, 422, 424 and 426 are surrounded by the spacer 438. The second side regions of the nanowires 420, 422, 424 and 426 are surrounded by the spacer 439. The spacers 438 and 439 are formed on the semiconductor substrate sub. The nanowires 420, 422, 424 and 426 that are surrounded by the gate structure are nanowire channel regions of the first select transistor $M_{GAA\_sel1}$. The two drain/source structures 427 and 429 are respectively located on both sides of the gate structure. The drain/source structure 427 is electrically contacted with the first terminals of the nanowires 420, 422, 424 and 426. The drain/source structure 429 is electrically contacted with the second terminals of the nanowires 420, 422, 424 and 426. In an embodiment, the drain/source structure 427, the drain/source structure 429 and the nanowires 420, 422, 424 and 426 may have the same dopant type.

The antifuse transistor $M_{GAA\_AF}$ comprises the drain/source structure 429, a drain/source structure 459, a gate structure and four nanowires 450, 452, 454 and 456. The gate structure is formed over the semiconductor sub. The gate structure comprises two spacers 468, 469, gate dielectric layers 460, 462, 464, 466 and a gate layer 461. The gate dielectric layer 460 surrounds the central region of the nanowire 450. The gate dielectric layer 462 surrounds the central region of the nanowire 452. The gate dielectric layer 464 surrounds the central region of the nanowire 454. The gate dielectric layer 466 surrounds the central region of the nanowire 456. The gate layer 461 surrounds the gate dielectric layers 460, 462, 464 and 466. The first side regions of the nanowires 450, 452, 454 and 456 are surrounded by the spacer 468. The second side regions of the nanowires 450, 452, 454 and 456 are surrounded by the spacer 469. The spacers 468 and 469 are formed on and contacted with the semiconductor substrate sub. The nanowires 450, 452, 454 and 456 that are surrounded by the gate structure are nanowire channel regions of the antifuse transistor $M_{GAA\_AF}$.

According to the first embodiment of the present invention, the two drain/source structures 429 and 459 are respectively located on both sides of the gate structure. The drain/source structure 429 is electrically contacted with the first terminals of the nanowires 450, 452, 454 and 456. The drain/source structure 459 is electrically contacted with the second terminals of the nanowires 450 and 452. That is, the drain/source structure 459 is not electrically contacted with the second terminals of the nanowires 454 and 456. In an embodiment, the drain/source structure 429, the drain/source structure 459 and the nanowires 450, 452, 454 and 456 may have the same dopant type.

The second select transistor $M_{GAA\_sel2}$ comprises the drain/source structure 459, a drain/source structure 479, a gate structure and four nanowires 470, 472, 474 and 476. The gate structure is formed over the semiconductor sub. The gate structure comprises two spacers 488, 489, gate dielectric layers 480, 482, 484, 486 and a gate layer 481. The gate dielectric layer 480 surrounds the central region of the nanowire 470. The gate dielectric layer 482 surrounds the central region of the nanowire 472. The gate dielectric layer 484 surrounds the central region of the nanowire 474. The gate dielectric layer 486 surrounds the central region of the nanowire 476. The gate layer 481 surrounds the gate dielectric layers 480, 482, 484 and 486. The first side regions of the nanowires 470, 472, 474 and 476 are surrounded by the spacer 488. The second side regions of the nanowires 470, 472, 474 and 476 are surrounded by the spacer 489. The spacers 488 and 489 are formed on the semiconductor substrate sub. The nanowires 470, 472, 474 and 476 that are surrounded by the gate structure are nanowire channel regions of the second select transistor $M_{GAA\_sel2}$.

According to the first embodiment of the present invention, the two drain/source structures 459 and 479 are respectively located on both sides of the gate structure. The drain/source structure 459 is electrically contacted with the second terminals of the nanowires 470 and 472. That is, the drain/source structure 459 is not electrically contacted with the second terminals of the nanowires 474 and 476. The drain/source structure 479 is electrically contacted with the second terminals of the nanowires 470, 472, 474 and 476. In an embodiment, the drain/source structure 459, the drain/source structure 479 and the nanowires 470, 472, 474 and 476 may have the same dopant type.

In the first select transistor $M_{GAA\_sel1}$, the drain/source structure 427 is connected with a first bit line $BL_1$, and the gate layer 431 is connected with a first word line $WL_1$. In the antifuse transistor $M_{GAA\_AF}$, the gate layer 461 is connected with an antifuse control line AF. In the second select transistor $M_{GAA\_sel2}$, the drain/source structure 479 is connected with a second bit line $BL_2$, and the gate layer 481 is connected with a second word line $WL_2$.

Figures 3A, 3B:
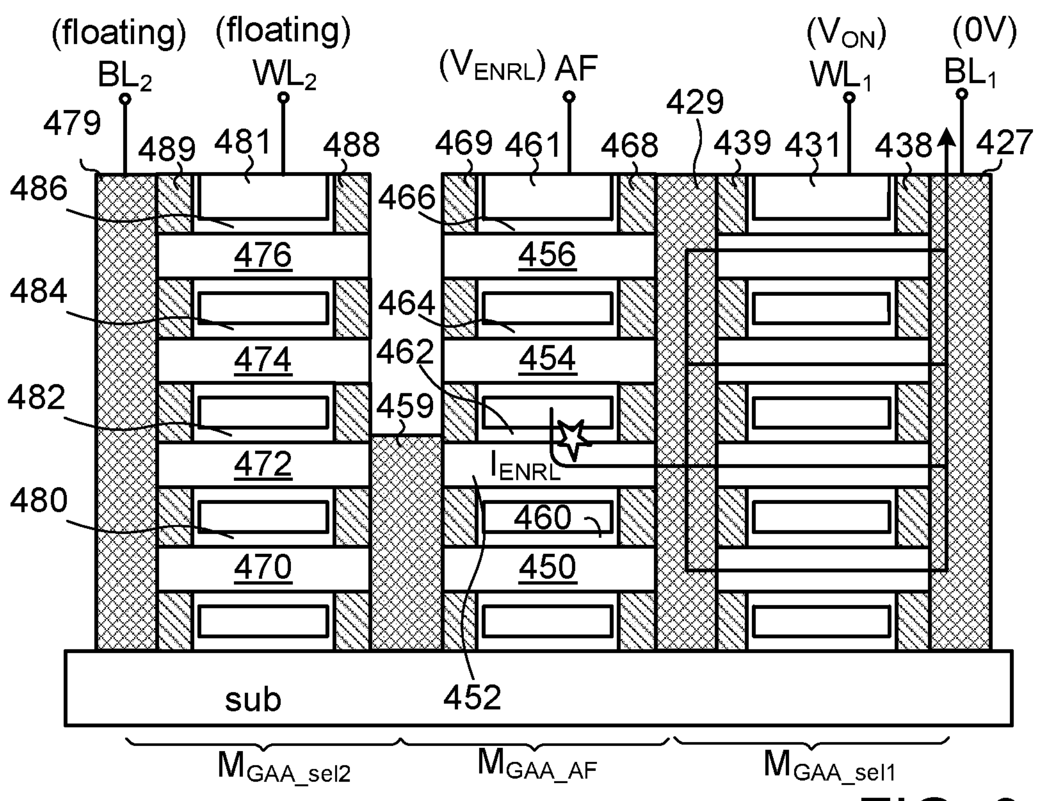
FIG. 3A and FIG. 3B schematically illustrate associated bias voltages for performing an enroll action on the antifuse-type OTP memory cell according to the first embodiment of the present invention.

FIG. 3A and FIG. 3B schematically illustrate associated bias voltages for performing an enroll action on the antifuse-type OTP memory cell according to the first embodiment of the present invention. FIG. 3C and FIG. 3D schematically illustrate associated bias voltages for performing a read action on the antifuse-type OTP memory cell according to the first embodiment of the present invention.

In the OTP memory cell of the first embodiment, the region between the first bit line $BL_1$ and the antifuse control line AF is an enroll path. When the first select transistor $M_{GAA\_sel1}$ is turned on, the enroll path is turned on. When the first select transistor $M_{GAA\_sel1}$ is turned off, the enroll path is turned off. Similarly, the region between the second bit line $BL_2$ and the antifuse control line AF is a read path. When the second select transistor $M_{GAA\_sel2}$ is turned on, the read path is turned on. When the second select transistor $M_{GAA\_sel2}$ is turned off, the read path is turned off.

Please refer to FIG. 3A and FIG. 3B. When the enroll action is performed, the first bit line $BL_1$ receives a ground voltage (0V), the first word line $WL_1$ receives an on voltage VON, the antifuse control line AF receives an enroll voltage $V_{ENRL}$, the second word line $WL_2$ is in a floating state, and the second bit line $BL_2$ is in the floating state. For example, the enroll voltage $V_{ENRL}$ is in the range between 3V and 6V, and the on voltage VON is in the range between 0.4V and 3V. Under this circumstance, the first select transistor $M_{GAA\_sel1}$ is turned on, and the second select transistor $M_{GAA\_sel2}$ is turned off. That is, the enroll path is turned on, and the read path is turned off.

In the enroll path, the first select transistor $M_{GAA\_sel1}$ is turned on. Consequently, the ground voltage (0V) of the first bit line $BL_1$ is transmitted to the drain/source structure 429 and the nanowires 450, 452, 454 and 456 of the antifuse transistor $M_{GAA\_AF}$ through the first select transistor $M_{GAA\_sel1}$. Consequently, when the antifuse control line AF receives the enroll voltage $V_{ENRL}$, the voltage stress between the nanowires 450, 452, 454 and 456 and the gate layer 461 of the antifuse transistor $M_{GAA\_AF}$ is equal to the enroll voltage $V_{ENRL}$. Under this circumstance, one of the gate dielectric layers 460, 462, 464 and 466 of the antifuse transistor $M_{GAA\_AF}$ is ruptured.

Due to the process variation of the OTP memory cell, it is unable to predict which of the gate dielectric layers 460, 462, 464 and 466 of the antifuse transistor $M_{GAA\_AF}$ is ruptured when the enroll action is performed. Consequently, the PUF technology can be applied to the antifuse-type OTP memory cell of the first embodiment.

For example, in the OTP memory cell as shown in FIG. 3A, the gate dielectric layer 462 is ruptured after the enroll action is completed. Consequently, an enroll current $I_{ENRL}$ is generated. The enroll current $I_{ENRL}$ flows from the antifuse control line AF to the first bit line $BL_1$ through the gate layer 461, the gate dielectric layer 462, the nanowire 452, the drain/source structure 429 and the first select transistor $M_{GAA\_sel1}$. Since the gate dielectric layer 462 is ruptured, the region between the gate layer 461 and the nanowire 452 has a low resistance value.

Alternatively, in the OTP memory cell as shown in FIG. 3B, the gate dielectric layer 466 is ruptured when the enroll action is performed. Consequently, an enroll current $I_{ENRL}$ is generated. The enroll current $I_{ENRL}$ flows from the antifuse control line AF to the first bit line $BL_1$ through the gate layer 461, the gate dielectric layer 466, the nanowire 456, the drain/source structure 429 and the first select transistor $M_{GAA\_sel1}$. Since the gate dielectric layer 466 is ruptured, the region between the gate layer 461 and the nanowire 456 has a low resistance value.

In FIG. 3A, the gate dielectric layer 462 is ruptured when the enroll action is performed. In FIG. 3B, the gate dielectric layer 466 is ruptured when the enroll action is performed. In some other embodiments, the gate dielectric layer 460 or the gate dielectric layer 464 is ruptured when the enroll action is performed.

In the OTP memory cell of the first embodiment, only the nanowires 450 and 452 of the antifuse transistor $M_{GAA\_AF}$ are connected with the drain/source structure 459. However, the nanowires 454 and 456 of the antifuse transistor $M_{GAA\_AF}$ are not connected with the drain/source structure 459. Since the nanowires 454 and 456 of the antifuse transistor $M_{GAA\_AF}$ are not connected between the second bit line $BL_2$ and the antifuse control line AF, the nanowires 454 and 456 are not included in the read path. That is, only the nanowires 450 and 452 of the antifuse transistor $M_{GAA\_AF}$ are included in the read path.

Please refer to FIGS. 3C and 3D. When the read action is performed, the first bit line $BL_1$ is in the floating state, the first word line $WL_1$ is in the floating state, the antifuse control line AF receives a read voltage $V_{RD}$, the second word line $WL_2$ receives the on voltage VON, and the second bit line $BL_2$ receives the ground voltage (0V). For example, the read voltage $V_{RD}$ is in the range between 0.75V and 1.2V. Under this circumstance, the second select transistor $M_{GAA\_sel2}$ is turned on, and the first select transistor $M_{GAA\_sel1}$ is turned off. That is, the read path is turned on, and the enroll path is turned off.

As shown in FIG. 3C, the gate dielectric layer 462 of the antifuse transistor $M_{GAA\_AF}$ is ruptured, and the region between the nanowire 452 and the gate layer 461 has a low resistance value. Under this circumstance, the read path of the OTP memory cell generates a higher read current $I_{RD}$. The read current $I_{RD}$ flows from the antifuse control line AF to the second bit line $BL_2$ through the gate layer 461, the gate dielectric layer 462, the nanowire 452, the drain/source structure 459 and the second select transistor $M_{GAA\_sel1}$. Since the other gate dielectric layers 460, 464 and 466 of the antifuse transistor $M_{GAA\_AF}$ are not ruptured, the read current $I_{RD}$ does not flow through the corresponding nanowires 450, 454 and 456.

Similarly, if the gate dielectric layer 460 of the antifuse transistor $M_{GAA\_AF}$ is ruptured, the read path (i.e., the second bit line $BL_2$) generates a higher read current $I_{RD}$ when the read action is performed. The operating principles are similar to those mentioned above, and not redundantly described herein.

As shown in FIG. 3D, the gate dielectric layer 466 of the antifuse transistor $M_{GAA\_AF}$ is ruptured, and the region between the nanowire 456 and the gate layer 461 has a low resistance value. Since the second terminal of the nanowire 456 is not electrically contacted with the drain/source structure 459, the second terminal of the nanowire 456 is in the floating state. That is, the second terminal of the nanowire 456 is not connected with the second select transistor $M_{GAA\_sel2}$. Under this circumstance, no read current is generated by the OTP memory cell. That is, the magnitude of the current flowing through the read path between the antifuse control line AF and the second bit line $BL_2$ is nearly zero.

Similarly, if the gate dielectric layer 464 of the antifuse transistor $M_{GAA\_AF}$ is ruptured, no read current is generated by the OTP memory cell. That is, the magnitude of the current flowing through the read path (i.e., the second bit line $BL_2$) is nearly zero when the read action is performed. The operating principles are similar to those mentioned above, and not redundantly described herein.

As mentioned above, the read action is performed after the enroll action is completed. When the read action is performed, one bit of a random code can be determined according to the magnitude of the read current $I_{RD}$ in the second bit line $BL_2$. For example, a current comparator is provided. The current comparator receives the read current $I_{RD}$ and a reference current Iref. If the magnitude of the read current $I_{RD}$ is higher than the magnitude of the reference current Iref, a first logic value (e.g., "0") is determined as the random code. Whereas, if the magnitude of the read current IRS is lower than the magnitude of the reference current Iref, a second logic value (e.g., "1") is determined as the random code.

From the above description, the present invention provides the OTP memory cell for the PUF technology. In the OTP memory cell, the antifuse transistor $M_{GAA\_AF}$ is a GAA transistor. The antifuse transistor $M_{GAA\_AF}$ comprises plural nanowires. These nanowires are divided into second groups. The first terminals of the nanowires in the first group are electrically contacted with the first drain/source structure. The second terminals of the nanowires in the first group are electrically contacted with the second drain/source structure. The first terminals of the nanowires in the second group are electrically contacted with the first drain/source structure. The second terminals of the nanowires in the second group are not electrically contacted with the second drain/source structure.

For example, in the OTP memory cell of FIG. 2, the four nanowires 450, 452, 454 and 456 of the antifuse transistor $M_{GAA\_AF}$ are divided into two group. The first terminals of the nanowires 450 and 452 in the first group are electrically contacted with the first drain/source structure 429. The second terminals of the nanowires 450 and 452 in the first group are electrically contacted with the second drain/source structure 459. The first terminals of the nanowires 454 and 456 in the second group are electrically contacted with the first drain/source structure 429. The second terminals of the nanowires 454 and 456 in the second group are not electrically contacted with the second drain/source structure 459.

If one of the gate dielectric layers 460 and 462 surrounding the nanowires 450 and 452 in the first group is ruptured after the enroll action is completed, the implementation of the read action can confirm that the one-bit random code has the first logic value (e.g., "0") according to the magnitude of the read current $I_{RD}$. Whereas, if one of the gate dielectric layers 464 and 466 surrounding the nanowires 454 and 456 in the second group is ruptured after the enroll action is completed, the implementation of the read action can confirm that the one-bit random code has the second logic value (e.g., "1") according to the magnitude of the read current $I_{RD}$.

In the OTP memory cell of the first embodiment, each of the first select transistor $M_{GAA\_sel1}$, the second select transistor $M_{GAA\_sel2}$ and the antifuse transistor $M_{GAA\_AF}$ has four nanowires. It is noted that numerous modifications and alterations may be made while retaining the teachings of the invention. For example, in some other embodiments, the first select transistor $M_{GAA\_sel1}$ has X nanowires, the second select transistor $M_{GAA\_sel2}$ has Y nanowires, and the antifuse transistor $M_{GAA\_AF}$ has Z nanowires. Moreover, the Z nanowires of the antifuse transistor $M_{GAA\_AF}$ are divided into a first group and a second group. The first select transistor $M_{GAA\_sel1}$ is electrically connected with the first group of nanowires and the second group of nanowires in the antifuse transistor $M_{GAA\_AF}$. The second select transistor $M_{GAA\_sel2}$ is electrically connected with the first group of nanowires in the antifuse transistor $M_{GAA\_AF}$ only.

For example, in a variant example of the OTP memory cell of the first embodiment, the first select transistor $M_{GAA\_sel1}$ has 1 nanowire (X=1), the second select transistor $M_{GAA\_sel2}$ has 1 nanowire (Y=1), and the antifuse transistor $M_{GAA\_AF}$ has two nanowires (Z=2). Due to this structural design, the antifuse-type OTP memory cell for the PUF technology has the smallest size.

It is noted that the structure of the OTP memory cell of the first embodiment may be properly modified. For example, as shown in FIG. 2, the drain/source structure 459 is electrically contacted with the two nanowires 450 and 452 of the antifuse transistor $M_{GAA\_AF}$ only. Consequently, the drain/source structure 479 of the second select transistor $M_{GAA\_sel2}$ may be properly modified. In a variant example, the drain/source structure 479 is electrically contacted with the two nanowires 470 and 472 only, but the drain/source structure 479 is not electrically contacted with the two nanowires 474 and 476. Similarly, the PUF technology can also be applied to the OTP memory cell with the modified structure.

Figure 4:
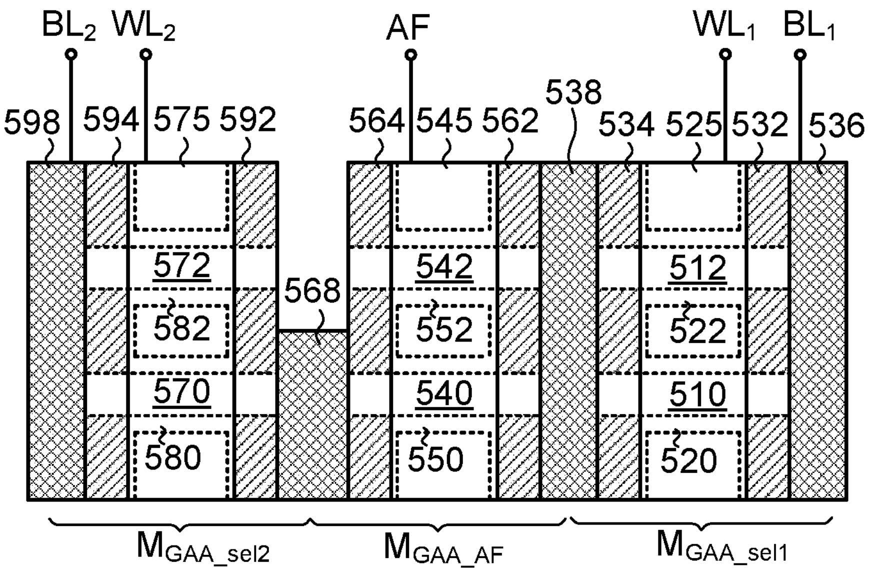
FIG. 4 is a schematic top view illustrating a variant example of the OTP memory cell of the first embodiment.

Moreover, each of the GAA transistors used in the OTP memory cell of the first embodiment may have the structure as shown in FIG. 1E. FIG. 4 is a schematic top view illustrating a variant example of the OTP memory cell of the first embodiment. As shown in FIG. 4, the OTP memory cell comprises a first select transistor $M_{GAA\_sel1}$, a second select transistor $M_{GAA\_sel2}$ and an antifuse transistor $M_{GAA\_AF}$. Each of the first select transistor $M_{GAA\_sel1}$, the second select transistor $M_{GAA\_sel1}$ and the antifuse transistor $M_{GAA\_AF}$ has the structure of the GAA transistor as shown in FIG. 1E. That is, each GAA transistor has six nanowires. The six nanowires are vertically arranged along two lines. Three nanowires are arranged along the first line. The other three nanowires are arranged along the second line. The detailed structure of the GAA transistor will not be redundantly described herein.

The first select transistor $M_{GAA\_sel1}$ comprises a drain/source structure 536, a drain/source structure 538, a gate structure and plural nanowires. The plural nanowires are vertically arranged along two lines. For example, the nanowire 510 and other two nanowires (not shown) are arranged along the first line, and the nanowire 512 and other two nanowires (not shown) are arranged along the second line. The gate structure comprises two spacers 532, 534, plural gate dielectric layers (e.g., 520 and 522) and a gate layer 525. All of the plural nanowires 510, 512 are surrounded by the gate structure. The drain/source structure 536 is electrically contacted with the first terminals of all of the plural nanowires 510, 512. The drain/source structure 538 is electrically contacted with the second terminals of all of the plural nanowires 510, 512. Moreover, the drain/source structure 536 is connected with a first bit line $BL_1$, and the gate layer 525 is connected with a first word line $WL_1$.

The antifuse transistor $M_{GAA\_AF}$ comprises the drain/source structure 538, a drain/source structure 568, a gate structure and plural nanowires. The plural nanowires are vertically arranged along two lines. For example, the nanowire 540 and other two nanowires (not shown) are arranged along the first line, and the nanowire 542 and other two nanowires (not shown) are arranged along the second line. The gate structure comprises two spacers 562, 564, plural gate dielectric layers (e.g., 550 and 552) and a gate layer 545. All of the plural nanowires 540, 542 are surrounded by the gate structure. The drain/source structure 538 is electrically contacted with the first terminals of all of the plural nanowires 540, 542. The drain/source structure 568 is electrically contacted with the second terminals of the nanowires in the first line (i.e., the nanowire 540 and the other two nanowires) only. The drain/source structure 568 is not electrically contacted with the second terminals of the nanowires in the second line (i.e., the nanowire 542 and the other two nanowires). Moreover, the gate layer 545 is connected with an antifuse control line AF.

The second select transistor $M_{GAA\_sel2}$ comprises the drain/source structure 568, a drain/source structure 598, a gate structure and plural nanowires. The plural nanowires are vertically arranged along two lines. For example, the nanowire 570 and other two nanowires (not shown) are arranged along the first line, and the nanowire 572 and other two nanowires (not shown) are arranged along the second line. The gate structure comprises two spacers 592, 594, plural gate dielectric layers (e.g., 580 and 582) and a gate layer 575. All of the plural nanowires 570, 572 are surrounded by the gate structure. The drain/source structure 568 is electrically contacted with the first terminals of (i.e., the nanowire 570 and the other two nanowires). The drain/source structure 598 is electrically contacted with the second terminals of all of the plural nanowires 570, 572. Moreover, the drain/source structure 598 is connected with a second bit line $BL_2$, and the gate layer 575 is connected with a second word line $WL_2$. In another variant example of the OTP memory cell as shown in FIG. 4, the drain/source structure 598 is electrically contacted with the nanowire 570 only, but the drain/source structure 598 is not electrically contacted with the nanowire 572.

The methods of performing the enroll action and the read action on the OTP memory cell of FIG. 4 are similar to those of FIG. 2, and not redundantly described herein.

In another variant example of the OTP memory cell of the first embodiment, only the antifuse transistor is implemented with the GAA transistor, but the select transistors are implemented with other appropriate transistors such as fin field-effect transistors (Fin-FETs). For example, in another embodiment, the antifuse transistor $M_{GAA\_AF}$ with the structure of the GAA transistor as shown in FIG. 2 and two select transistors with the structures of the fin field-effect transistors (Fin-FETs) are collaboratively formed as the antifuse-type OTP memory cell of the present invention.

Take the antifuse transistor $M_{GAA\_AF}$ with the structure of the GAA transistor as shown in FIG. 2 for example. The first drain/source terminal of the first select transistor is connected with the first bit line $BL_1$. The gate terminal of the first select transistor is connected with the first word line $WL_1$. The second drain/source terminal of the first select transistor is connected with the drain/source structure 429 of the antifuse transistor $M_{GAA\_AF}$. The first drain/source terminal of the second select transistor is connected with the drain/source structure 459 of the antifuse transistor $M_{GAA\_AF}$. The gate terminal of the first select transistor is connected with the second word line $WL_2$. The second drain/source terminal of the second select transistor is connected with the second bit line $BL_2$.

Figure 5A:
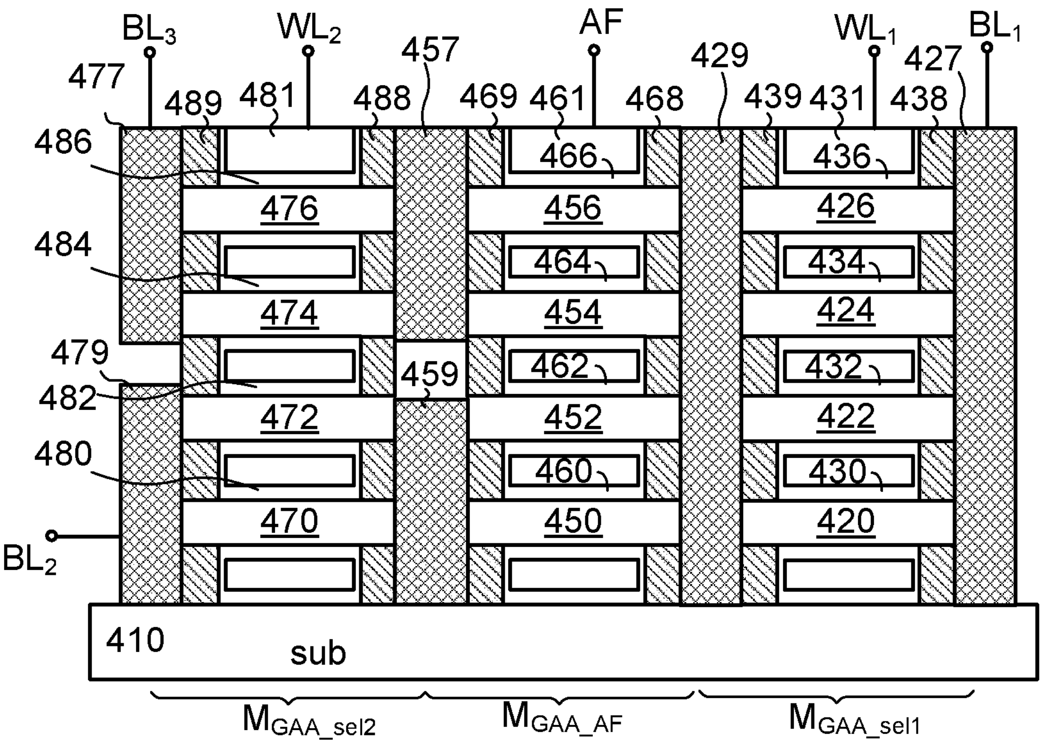
FIG. 5A is a schematic cross-sectional view illustrating the structure of an antifuse-type one time programming memory cell for a PUF technology according to a second embodiment of the present invention.

FIG. 5A is a schematic cross-sectional view illustrating the structure of an antifuse-type one time programming memory cell for a PUF technology according to a second embodiment of the present invention. In comparison with the OTP memory cell of the first embodiment, the OTP memory cell of the second embodiment further comprises a drain/source structure 457, a drain/source structure 477 and a third bit line $BL_3$. For succinctness, only the distinguished structures will be described as follows. The other structures of the OTP memory cell of this embodiment are similar to those of OTP memory cell as shown in FIG. 2, and not redundantly described herein.

In the OTP memory cell of the second embodiment, the drain/source structure 457 is electrically contacted with the second terminals of the nanowires 454 and 456 of the antifuse transistor $M_{GAA\_AF}$, and the drain/source structure 457 is also electrically contacted with the first terminals of the nanowires 474 and 476 of the second select transistor $M_{GAA\_sel2}$. The drain/source structure 477 is electrically contacted with the second terminals of the nanowires 474 and 476 of the second select transistor $M_{GAA\_sel2}$. Moreover, the drain/source structure 477 is connected with the third bit line $BL_3$. In this embodiment, the drain/source structure 479 is electrically contacted with the second terminals of the nanowires 470 and 472 of the second select transistor $M_{GAA\_sel2}$. Moreover, the drain/source structure 479 is connected with the second bit line $BL_2$. The drain/source structure 457 is not electrically contacted with the drain/source structure 459. The drain/source structure 477 is not electrically contacted with the drain/source structure 479.

In the OTP memory cell of the second embodiment, the region between the first bit line $BL_1$ and the antifuse control line AF is an enroll path. When the first select transistor $M_{GAA\_sel1}$ is turned on, the enroll path is turned on. When the first select transistor $M_{GAA\_sel1}$ is turned off, the enroll path is turned off. In other words, the enroll path in the OTP memory cell of the second embodiment is identical to the enroll path in the OTP memory cell of the first embodiment.

The methods of performing the enroll action on the OTP memory cell of the second embodiment are similar to those of the first embodiment. That is, after the enroll action is completed, one of the four gate dielectric layers 460, 462, 464 and 466 of the antifuse transistor $M_{GAA\_AF}$ is ruptured. Due to the process variation of the OTP memory cell, it is unable to predict which of the gate dielectric layers 460, 462, 464 and 466 of the antifuse transistor $M_{GAA\_AF}$ is ruptured when the enroll action is performed. Consequently, the PUF technology can be applied to the antifuse-type OTP memory cell of the second embodiment.

In the OTP memory cell of the second embodiment, the region between the second bit line $BL_2$ and the antifuse control line AF is a first read path, and the region between the third bit line $BL_3$ and the antifuse control line AF is a second read path. When the second select transistor $M_{GAA\_sel2}$ is turned on, both of the first read path and the second read path are turned on. When the second select transistor $M_{GAA\_sel2}$ is turned off, both of the first read path and the second read path are turned off.

Figures 5B, 5C:
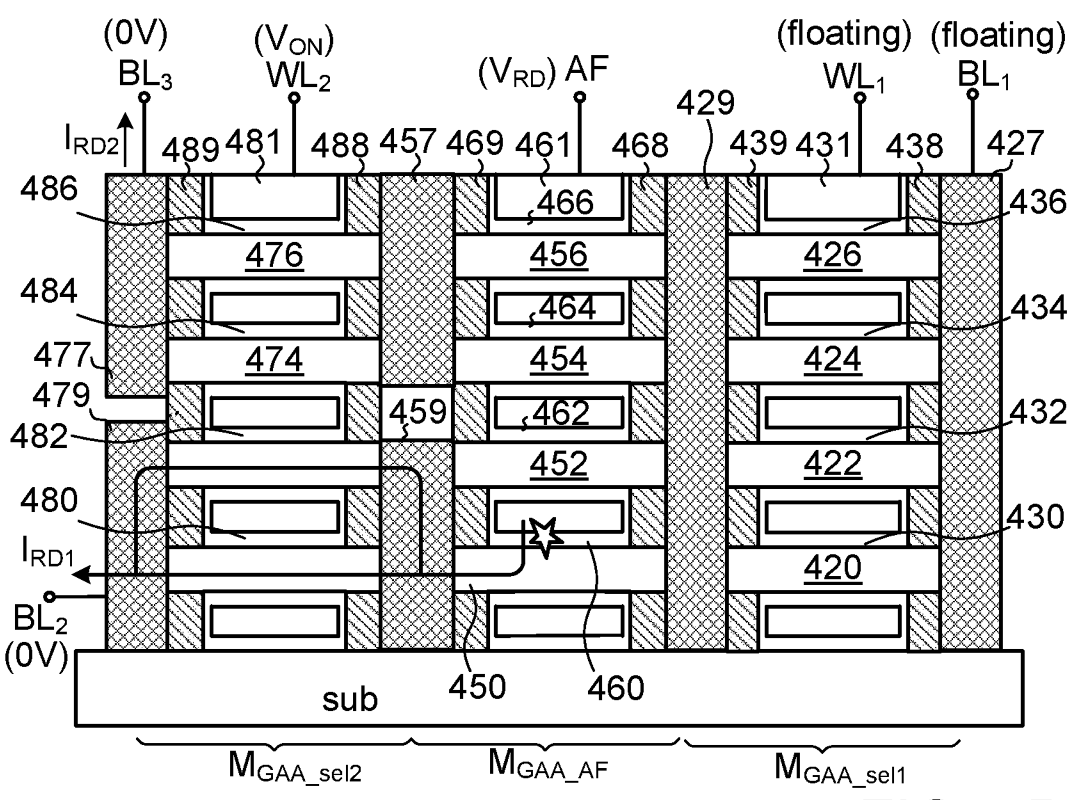
FIG. 5B and FIG. 5C schematically illustrate associated bias voltages for performing a read action on the antifuse-type OTP memory cell according to the second embodiment of the present invention.

FIG. 5B and FIG. 5C schematically illustrate associated bias voltages for performing a read action on the antifuse-type OTP memory cell according to the second embodiment of the present invention.

When the read action is performed, the first bit line $BL_1$ is in the floating state, the first word line $WL_1$ is in the floating state, the antifuse control line AF receives a read voltage $V_{RD}$, the second word line $WL_2$ receives the on voltage VON, the second bit line $BL_2$ receives the ground voltage (0V), and the third bit line $BL_3$ receives the ground voltage (0V). For example, the read voltage $V_{RD}$ is in the range between 0.75V and 1.2V. Under this circumstance, the second select transistor $M_{GAA\_sel2}$ is turned on, and the first select transistor $M_{GAA\_sel1}$ is turned off. That is, the first read path and the second read path are turned on, and the enroll path is turned off.

As shown in FIG. 5B, the gate dielectric layer 460 of the antifuse transistor $M_{GAA\_AF}$ is ruptured, and the region between the nanowire 450 and the gate layer 461 has a low resistance value. Under this circumstance, the first read path of the OTP memory cell generates a higher read current $I_{RD1}$. The read current $I_{RD1}$ flows from the antifuse control line AF to the second bit line $BL_2$ through the gate layer 461, the gate dielectric layer 460, the nanowire 450, the drain/source structure 459, the second select transistor $M_{GAA\_sel2}$ and the drain/source structure 479. Since the other gate dielectric layers 464 and 466 of the antifuse transistor $M_{GAA\_AF}$ are not ruptured, the read current $I_{RD2}$ in the second read path (i.e., the third bit line $BL_3$) is very low (e.g., nearly zero).

Similarly, if the gate dielectric layer 462 of the antifuse transistor $M_{GAA\_AF}$ is ruptured, the first read path (i.e., the second bit line $BL_2$) generates a higher read current $I_{RD1}$ and the read current $I_{RD2}$ in the second read path (i.e., the third bit line $BL_3$) is very low (e.g., nearly zero) when the read action is performed. The operating principles are similar to those mentioned above, and not redundantly described herein.

As shown in FIG. 5C, the gate dielectric layer 466 of the antifuse transistor $M_{GAA\_AF}$ is ruptured, and the region between the nanowire 456 and the gate layer 461 has a low resistance value. Under this circumstance, the second read path of the OTP memory cell generates a higher read current $I_{RD2}$. The read current $I_{RD2}$ flows from the antifuse control line AF to the third bit line $BL_3$ through the gate layer 461, the gate dielectric layer 466, the nanowire 456, the drain/source structure 457, the second select transistor $M_{GAA\_sel2}$ and the drain/source structure 477. Since the other gate dielectric layers 460 and 462 of the antifuse transistor $M_{GAA\_AF}$ are not ruptured, the read current $I_{RD1}$ in the first read path (i.e., the second bit line $BL_2$) is very low (e.g., nearly zero).

Similarly, if the gate dielectric layer 464 of the antifuse transistor $M_{GAA\_AF}$ is ruptured, the second read path (i.e., the third bit line $BL_3$) generates a higher read current $I_{RD2}$ and the read current $I_{RD1}$ in the first read path (i.e., the second bit line $BL_2$) is very low (e.g., nearly zero) when the read action is performed. The operating principles are similar to those mentioned above, and not redundantly described herein.

As mentioned above, the read action is performed after the enroll action is completed. When the read action is performed, one bit of a random code can be determined according to the magnitude of the read current $I_{RD1}$ in the second bit line $BL_2$ and the magnitude of the read current $I_{RD2}$ in the third bit line $BL_3$. For example, a current comparator is provided. The current comparator receives the read current $I_{RD1}$ and the read current $I_{RD2}$. If the magnitude of the read current $I_{RD1}$ is higher than the magnitude of the read current $I_{RD2}$, a first logic value (e.g., "0") is determined as the random code. Whereas, if the magnitude of the read current $I_{RD1}$ is lower than the magnitude of the read current $I_{RD2}$, a second logic value (e.g., "1") is determined as the random code.

Figure 6:
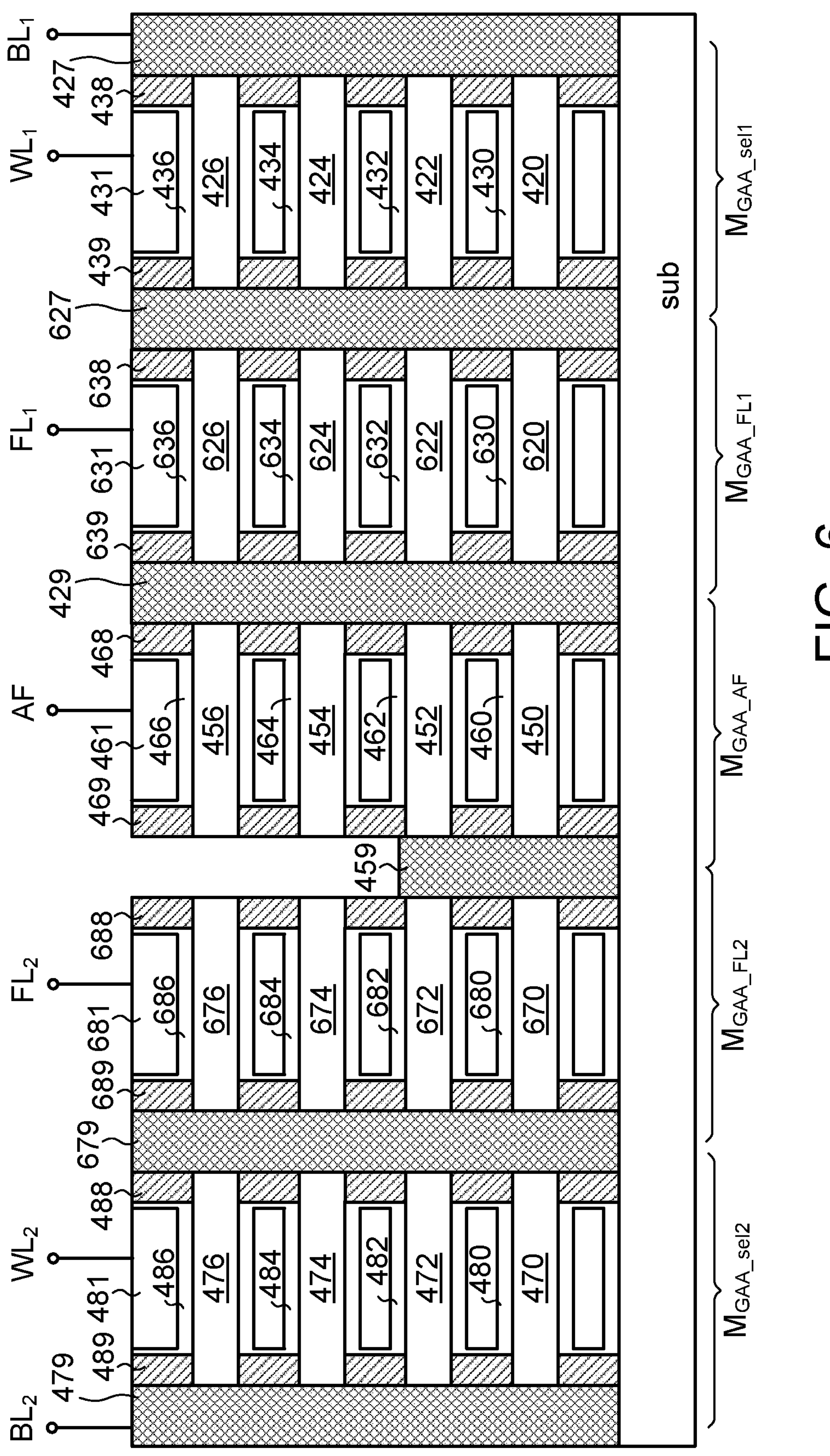
FIG. 6 is a schematic cross-sectional view illustrating the structure of an antifuse-type one time programming memory cell for a PUF technology according to a third embodiment of the present invention.

FIG. 6 is a schematic cross-sectional view illustrating the structure of an antifuse-type one time programming memory cell for a PUF technology according to a third embodiment of the present invention. In comparison with the OTP memory cell of the first embodiment, the OTP memory cell of the third embodiment further comprises a first following transistor $M_{GAA\_FL1}$ and a second following transistor $M_{GAA\_FL2}$. The first following transistor $M_{GAA\_FL1}$ is arranged between the antifuse transistor $M_{GAA\_AF}$ and the first select transistor $M_{GAA\_sel1}$. The second following transistor $M_{GAA\_FL2}$ is arranged between the antifuse transistor $M_{GAA\_AF}$ and the second select transistor $M_{GAA\_sel1}$.

In the third embodiment, the OTP memory cell comprises five GAA transistors. The structure of each of the five GAA transistors is similar to that of FIG. 10, and not redundantly described herein. The OTP memory cell includes the first select transistor $M_{GAA\_sel1}$, the second select transistor $M_{GAA\_sel2}$, the first following transistor $M_{GAA\_FL1}$, the second following transistor $M_{GAA\_FL2}$ and the antifuse transistor $M_{GAA\_AF}$. The structures of the first select transistor $M_{GAA\_sel1}$, the second select transistor $M_{GAA\_sel2}$ and the antifuse transistor $M_{GAA\_AF}$ are similar to those of the OTP memory cell of the first embodiment, and not redundantly described herein.

The first following transistor $M_{GAA\_FL1}$ comprises a drain/source structure 627, the drain/source structure 429, a gate structure and four nanowires 620, 622, 624 and 626. The gate structure is formed over the semiconductor sub. The gate structure comprises two spacers 638, 639, gate dielectric layers 630, 632, 634, 636 and a gate layer 631. The gate dielectric layer 630 surrounds the central region of the nanowire 620. The gate dielectric layer 632 surrounds the central region of the nanowire 622. The gate dielectric layer 634 surrounds the central region of the nanowire 624. The gate dielectric layer 636 surrounds the central region of the nanowire 626. The gate layer 631 surrounds the gate dielectric layers 630, 632, 634 and 636. The first side regions of the nanowires 620, 622, 624 and 626 are surrounded by the spacer 638. The second side regions of the nanowires 620, 622, 624 and 626 are surrounded by the spacer 639. The spacers 638 and 639 are formed on the semiconductor substrate sub. The nanowires 620, 622, 624 and 626 that are surrounded by the gate structure are nanowire channel regions of the first following transistor $M_{GAA\_FL1}$. The two drain/source structures 627 and 429 are respectively located on both sides of the gate structure. The drain/source structure 627 is electrically contacted with the first terminals of the nanowires 620, 622, 624 and 626. The drain/source structure 429 is electrically contacted with the second terminals of the nanowires 620, 622, 624 and 626. In an embodiment, the drain/source structure 627, the drain/source structure 429 and the nanowires 620, 622, 624 and 626 may have the same dopant type.

The second following transistor $M_{GAA\_FL2}$ comprises the drain/source structure 459, a drain/source structure 679, a gate structure and four nanowires 670, 672, 674 and 676. The gate structure is formed over the semiconductor sub. The gate structure comprises two spacers 688, 689, gate dielectric layers 680, 682, 684, 686 and a gate layer 681. The gate dielectric layer 680 surrounds the central region of the nanowire 670. The gate dielectric layer 682 surrounds the central region of the nanowire 672. The gate dielectric layer 684 surrounds the central region of the nanowire 674. The gate dielectric layer 686 surrounds the central region of the nanowire 676. The gate layer 681 surrounds the gate dielectric layers 680, 682, 684 and 686. The first side regions of the nanowires 670, 672, 674 and 676 are surrounded by the spacer 688. The second side regions of the nanowires 670, 672, 674 and 676 are surrounded by the spacer 689. The spacers 688 and 689 are formed on the semiconductor substrate sub. The nanowires 670, 672, 674 and 676 that are surrounded by the gate structure are nanowire channel regions of the second following transistor $M_{GAA\_FL2}$.

According to the first embodiment of the present invention, the two drain/source structures 459 and 679 are respectively located on both sides of the gate structure. The drain/source structure 459 is electrically contacted with the second terminals of the nanowires 670 and 672 and one terminal of the nanowires 450, 452. That is, the drain/source structure 459 is not electrically contacted with the second terminals of the nanowires 674 and 676 and the nanowires 454, 456. The drain/source structure 679 is electrically contacted with the second terminals of the nanowires 670, 672, 674 and 676. In an embodiment, the drain/source structure 459, the drain/source structure 679 and the nanowires 670, 672, 674 and 676 may have the same dopant type.

In the first following transistor $M_{GAA\_FL1}$, the gate layer 631 is connected with a first following control line $FL_1$. In the second following transistor $M_{GAA\_FL2}$, the gate layer 681 is connected with a second following control line $FL_2$.

In the OTP memory cell of the third embodiment, the region between the first bit line $BL_1$ and the antifuse control line AF is an enroll path. When the first select transistor $M_{GAA\_sel1}$ and the first following transistor $M_{GAA\_FL1}$ are turned on, the enroll path is turned on. When the first select transistor $M_{GAA\_sel1}$ and the first following transistor $M_{GAA\_FL1}$ are turned off, the enroll path is turned off. Similarly, the region between the second bit line $BL_2$ and the antifuse control line AF is a read path. When the second select transistor $M_{GAA\_sel2}$ and the second following transistor $M_{GAA\_FL2}$ are turned on, the read path is turned on. When the second select transistor $M_{GAA\_sel2}$ and the second following transistor $M_{GAA\_FL2}$ are turned off, the read path is turned off.

The methods of performing the enroll action and the read action on the OTP memory cell of the third embodiment are similar to those of the first embodiment. The methods of performing the enroll action and the read action will be described as follows.

When the enroll action is performed, the first bit line $BL_1$ receives a ground voltage (0V), the first word line $WL_1$ receives a first on voltage $V_{ON1}$, the first following control line $FL_1$ receives a second on voltage $V_{ON2}$, the antifuse control line AF receives an enroll voltage $V_{ENRL}$, the second word line $WL_2$ is in a floating state, the second following control line $FL_2$ is in the floating state, and the second bit line $BL_2$ is in the floating state. For example, the enroll voltage $V_{ENRL}$ is in the range between 3V and 6V, the first on voltage $V_{ON1}$ is in the range between 0.4V and 3V, and the second on voltage $V_{ON2}$ is in the range between 0.4V and 3V. Under this circumstance, the first select transistor $M_{GAA\_sel1}$ and the first following transistor $M_{GAA\_FL1}$ are turned on, and the second select transistor $M_{GAA\_sel2}$ and the second following transistor $M_{GAA\_FL2}$ are turned off. That is, the enroll path is turned on, and the read path is turned off.

In the enroll path, the first select transistor $M_{GAA\_sel1}$ and the first following transistor $M_{GAA\_FL1}$ are turned on. Consequently, the ground voltage (0V) of the first bit line $BL_1$ is transmitted to the drain/source structure 429 and the nanowires 450, 452, 454 and 456 of the antifuse transistor $M_{GAA\_AF}$ through the first select transistor $M_{GAA\_sel1}$ and the first following transistor $M_{GAA\_FL1}$. Consequently, when the antifuse control line AF receives the enroll voltage $V_{ENRL}$, the voltage stress between the nanowires 450, 452, 454 and 456 and the gate layer 461 of the antifuse transistor $M_{GAA\_AF}$ is equal to the enroll voltage $V_{ENRL}$. Under this circumstance, one of the gate dielectric layers 460, 462, 464 and 466 of the antifuse transistor $M_{GAA\_AF}$ is ruptured.

Due to the process variation of the OTP memory cell, it is unable to predict which of the gate dielectric layers 460, 462, 464 and 466 of the antifuse transistor $M_{GAA\_AF}$ is ruptured when the enroll action is performed. Consequently, the PUF technology can be applied to the antifuse-type OTP memory cell of the third embodiment.

Similarly, in the OTP memory cell of the third embodiment, only the nanowires 450 and 452 of the antifuse transistor $M_{GAA\_AF}$ are connected with the drain/source structure 459. However, the nanowires 454 and 456 of the antifuse transistor $M_{GAA\_AF}$ are not connected with the drain/source structure 459. Since the nanowires 454 and 456 of the antifuse transistor $M_{GAA\_AF}$ are not connected between the second bit line $BL_2$ and the antifuse control line AF, the nanowires 454 and 456 are not included in the read path. That is, only the nanowires 450 and 452 of the antifuse transistor $M_{GAA\_AF}$ are included in the read path.

When the read action is performed, the first bit line $BL_1$ is in the floating state, the first word line $WL_1$ is in the floating state, the first following control line $FL_1$ is in the floating state, the antifuse control line AF receives a read voltage $V_{RD}$, the second word line $WL_2$ receives the first on voltage $V_{ON1}$, the second following control line $FL_2$ receives the second on voltage $V_{ON2}$, and the second bit line $BL_2$ receives the ground voltage (0V). For example, the read voltage $V_{RD}$ is in the range between 0.75V and 1.2V. Under this circumstance, the second select transistor $M_{GAA\_sel2}$ and the second following transistor $M_{GAA\_FL2}$ are turned on, and the first select transistor $M_{GAA\_sel1}$ and the first following transistor $M_{GAA\_FL1}$ are turned off. That is, the read path is turned on, and the enroll path is turned off.

For example, if the gate dielectric layer 460 or the gate dielectric layer 462 of the antifuse transistor $M_{GAA\_AF}$ is ruptured, the read path (i.e., the second bit line $BL_2$) generates a higher read current $I_{RD}$ when the read action is performed. Whereas, if the gate dielectric layer 464 or the gate dielectric layer 466 of the antifuse transistor $M_{GAA\_AF}$ is ruptured, the read current $I_{RD}$ generated by the read path (i.e., the second bit line $BL_2$) is very low (i.e., nearly zero) when the read action is performed.

As mentioned above, the read action is performed after the enroll action is completed. When the read action is performed, one bit of a random code can be determined according to the magnitude of the read current $I_{RD}$ on the second bit line $BL_2$. For example, a current comparator is provided. The current comparator receives the read current $I_{RD}$ and a reference current Iref. If the magnitude of the read current $I_{RD}$ is higher than the magnitude of the reference current Iref, a first logic value (e.g., "0") is determined as the random code. Whereas, if the magnitude of the read current $I_{RD}$ is lower than the magnitude of the reference current Iref, a second logic value (e.g., "1") is determined as the random code.

From the above description, the present invention provides the OTP memory cell for the PUF technology. In the OTP memory cell, the antifuse transistor $M_{GAA\_AF}$ is a GAA transistor. The antifuse transistor $M_{GAA\_AF}$ comprises plural nanowires. These nanowires are divided into second groups. The first terminals of the nanowires in the first group are electrically contacted with the first drain/source structure. The second terminals of the nanowires in the first group are electrically contacted with the second drain/source structure. The first terminals of the nanowires in the second group are electrically contacted with the first drain/source structure. The second terminals of the nanowires in the second group are not electrically contacted with the second drain/source structure.

If one of the gate dielectric layers surrounding the nanowires in the first group is ruptured after the enroll action is completed, the implementation of the read action can confirm that the one-bit random code has the first logic value (e.g., "0") according to the magnitude of the read current $I_{RD}$. Whereas, if one of the gate dielectric layers surrounding the nanowires in the second group is ruptured after the enroll action is completed, the implementation of the read action can confirm that the one-bit random code has the second logic value (e.g., "1") according to the magnitude of the read current $I_{RD}$.

In the OTP memory cell of the third embodiment, each of the first select transistor $M_{GAA\_sel1}$, the second select transistor $M_{GAA\_sel2}$, the first following transistor $M_{GAA\_FL1}$, the second following transistor $M_{GAA\_FL2}$ and the antifuse transistor $M_{GAA\_AF}$ has four nanowires. It is noted that numerous modifications and alterations may be made while retaining the teachings of the invention. For example, in some other embodiments, the first select transistor $M_{GAA\_sel1}$ has X nanowires, the second select transistor $M_{GAA\_sel2}$ has Y nanowires, the antifuse transistor $M_{GAA\_AF}$ has Z nanowires, the first following transistor $M_{GAA\_FL1}$ has V nanowires, and the second following transistor $M_{GAA\_FL2}$ has W nanowires. Moreover, the Z nanowires of the antifuse transistor $M_{GAA\_AF}$ are divided into a first group and a second group. The first following transistor $M_{GAA\_FL1}$ is electrically connected with the first group of nanowires and the second group of nanowires in the antifuse transistor $M_{GAA\_AF}$. The second following transistor $M_{GAA\_FL2}$ is electrically connected with the first group of nanowires in the antifuse transistor $M_{GAA\_AF}$ only.

For example, in a variant example of the OTP memory cell of the third embodiment, the first select transistor $M_{GAA\_sel1}$ has 1 nanowire (X=1), the second select transistor $M_{GAA\_sel2}$ has 1 nanowire (Y=1), the first following transistor $M_{GAA\_FL1}$ has 1 nanowire (V=1), the second following transistor $M_{GAA\_FL2}$ has 1 nanowire (W=1), and the antifuse transistor $M_{GAA\_AF}$ has two nanowires (Z=2). Due to this structural design, the antifuse-type OTP memory cell for the PUF technology has the smallest size.

It is noted that the structure of the OTP memory cell of the third embodiment may be properly modified. For example, as shown in FIG. 6, the drain/source structure 459 is electrically contacted with the two nanowires 450 and 452 of the antifuse transistor $M_{GAA\_AF}$ only. Consequently, the drain/source structure 479 of the second select transistor $M_{GAA\_sel2}$ and drain/source structure 679 of the second following transistor $M_{GAA\_FL2}$ may be properly modified. In a variant example, the drain/source structure 479 is electrically contacted with the two nanowires 470 and 472 only, but the drain/source structure 479 is not electrically contacted with the two nanowires 474 and 476. Similarly, the drain/source structure 679 is electrically contacted with the two nanowires 670 and 672 of the second following transistor $M_{GAA\_FL2}$ and the two nanowires 470 and 472 of the second select transistor $M_{GAA\_sel2}$ only, but the drain/source structure 679 is not electrically contacted with the two nanowires 674 and 676 of the second following transistor $M_{GAA\_FL2}$ and the two nanowires 474 and 476 of the second select transistor $M_{GAA\_sel2}$. Similarly, the PUF technology can also be applied to the OTP memory cell with the modified structure.

Figure 7:
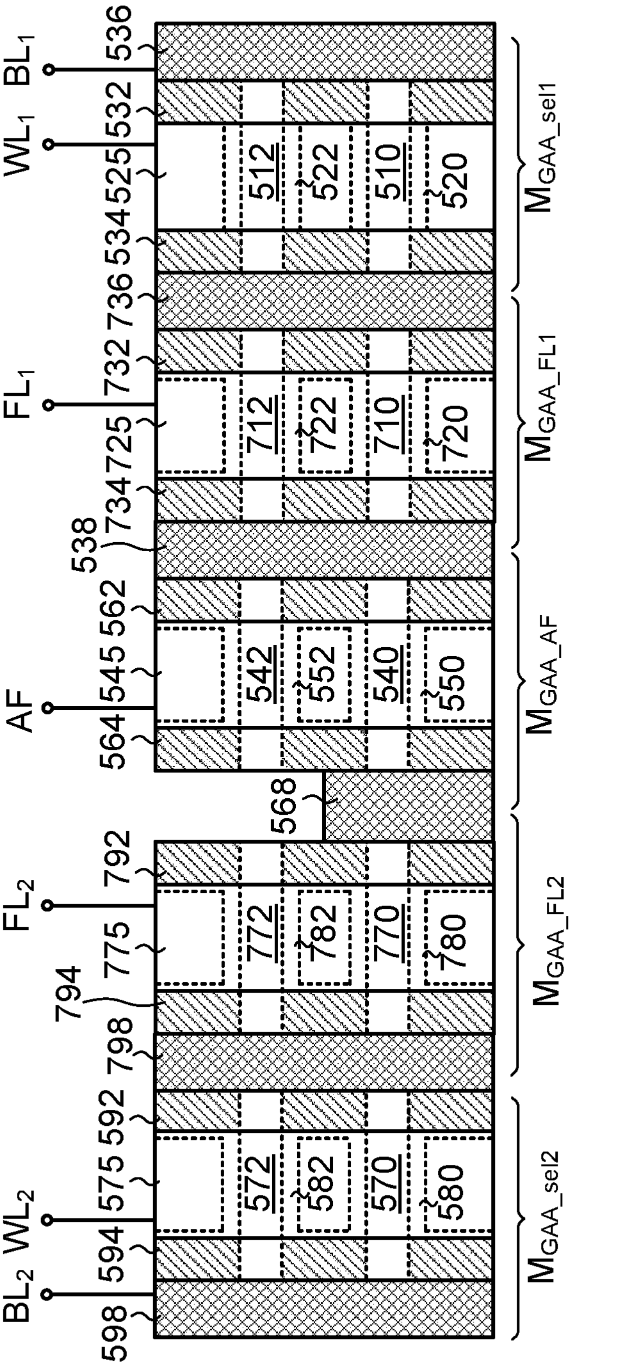
FIG. 7 is a schematic top view illustrating a variant example of the OTP memory cell of the third embodiment.

Moreover, each of the GAA transistors used in the OTP memory cell of the third embodiment may have the structure as shown in FIG. 1E. FIG. 7 is a schematic top view illustrating a variant example of the OTP memory cell of the third embodiment. In comparison with the OTP memory cell as shown in FIG. 4, the OTP memory cell as shown in FIG. 7 further comprises a first following transistor $M_{GAA\_FL1}$ and a second following transistor $M_{GAA\_FL2}$. For succinctness, only the structures of the first following transistor $M_{GAA\_FL1}$ and the second following transistor $M_{GAA\_FL2}$ will be described as follows. Each of the first following transistor $M_{GAA\_FL1}$ and the second following transistor $M_{GAA\_FL2}$ has six nanowires. The six nanowires are vertically arranged along two lines. Three nanowires are arranged along the first line. The other three nanowires are arranged along the second line.

The first following transistor $M_{GAA\_FL1}$ comprises a drain/source structure 736, the drain/source structure 538, a gate structure and plural nanowires. The plural nanowires are vertically arranged along two lines. For example, the nanowire 710 and other two nanowires (not shown) are arranged along the first line, and the nanowire 712 and other two nanowires (not shown) are arranged along the second line. The gate structure comprises two spacers 732, 734, plural gate dielectric layers (e.g., 720 and 722) and a gate layer 725. All of the plural nanowires 710, 712 are surrounded by the gate structure. The drain/source structure 736 is electrically contacted with the first terminals of all of the plural nanowires 710, 712. The drain/source structure 538 is electrically contacted with the second terminals of all of the plural nanowires 710, 712. Moreover, the gate layer 725 is connected with a first following control line $FL_1$.

The second following transistor $M_{GAA\_FL2}$ comprises the drain/source structure 568, a drain/source structure 798, a gate structure and plural nanowires. The plural nanowires are vertically arranged along two lines. For example, the nanowire 770 and other two nanowires (not shown) are arranged along the first line, and the nanowire 772 and other two nanowires (not shown) are arranged along the second line. The gate structure comprises two spacers 792, 794, plural gate dielectric layers (e.g., 780 and 782) and a gate layer 775. All of the plural nanowires 770, 772 are surrounded by the gate structure. The drain/source structure 568 is electrically contacted with the first terminals of (i.e., the nanowire 770 and the other two nanowires). The drain/source structure 568 is electrically contacted with the second terminals of all of the plural nanowires 770, 772. Moreover, the gate layer 775 is connected with a second following control line $FL_2$.

In a variant example of the OTP memory cell as shown in FIG. 7, the drain/source structure 798 is electrically contacted with the two nanowires 770 and 570 only, but the drain/source structure 798 is not electrically contacted with the two nanowires 772 and 572. Similarly, the drain/source structure 598 is electrically contacted with the nanowire 570 only, but the drain/source structure 598 is not electrically contacted with the nanowire 572. Accordingly, the nanowire 542 is in direct contact with the nanowire 772, and the nanowire 772 is in direct contact with the nanowire 572. In another variant example of the OTP memory cell as shown in FIG. 7, the drain/source structure 598 is electrically contacted with the nanowire 570 only, and the drain/source structure 798 is electrically contacted with the two nanowires 770 and 570 only.

The methods of performing the enroll action and the read action on the OTP memory cell of FIG. 7 are similar to those of FIG. 6, and not redundantly described herein.

In another variant example of the OTP memory cell of the third embodiment, only the antifuse transistor is implemented with the GAA transistor, but the select transistors and the following transistors are implemented with other appropriate transistors such as fin field-effect transistors (Fin-FETs). For example, in another embodiment, the antifuse transistor $M_{GAA\_AF}$ with the structure of the GAA transistor as shown in FIG. 6, two select transistors with the structures of the fin field-effect transistors (Fin-FETs) and two following transistors with the structures of the fin field-effect transistors (Fin-FETs) are collaboratively formed as the antifuse-type OTP memory cell of the present invention.

Take the antifuse transistor $M_{GAA\_AF}$ with the structure of the GAA transistor as shown in FIG. 6 for example. The first drain/source terminal of the first select transistor is connected with the first bit line $BL_1$. The gate terminal of the first select transistor is connected with the first word line $WL_1$. The second drain/source terminal of the first select transistor is connected with the first drain/source terminal of the first following transistor. The gate terminal of the first following transistor is connected with the first following control line $FL_1$. The first drain/source terminal of the first following transistor is connected with the drain/source structure 429 of the antifuse transistor $M_{GAA\_AF}$. The first drain/source terminal of the second following transistor is connected with the drain/source structure 459 of the antifuse transistor $M_{GAA\_AF}$. The gate terminal of the second following transistor is connected with the second following control line $FL_2$. The second drain/source terminal of the second following transistor is connected with the first drain/source terminal of the second select transistor. The gate terminal of the first select transistor is connected with the second word line $WL_2$. The second drain/source terminal of the second select transistor is connected with the second bit line $BL_2$.

Figure 8:
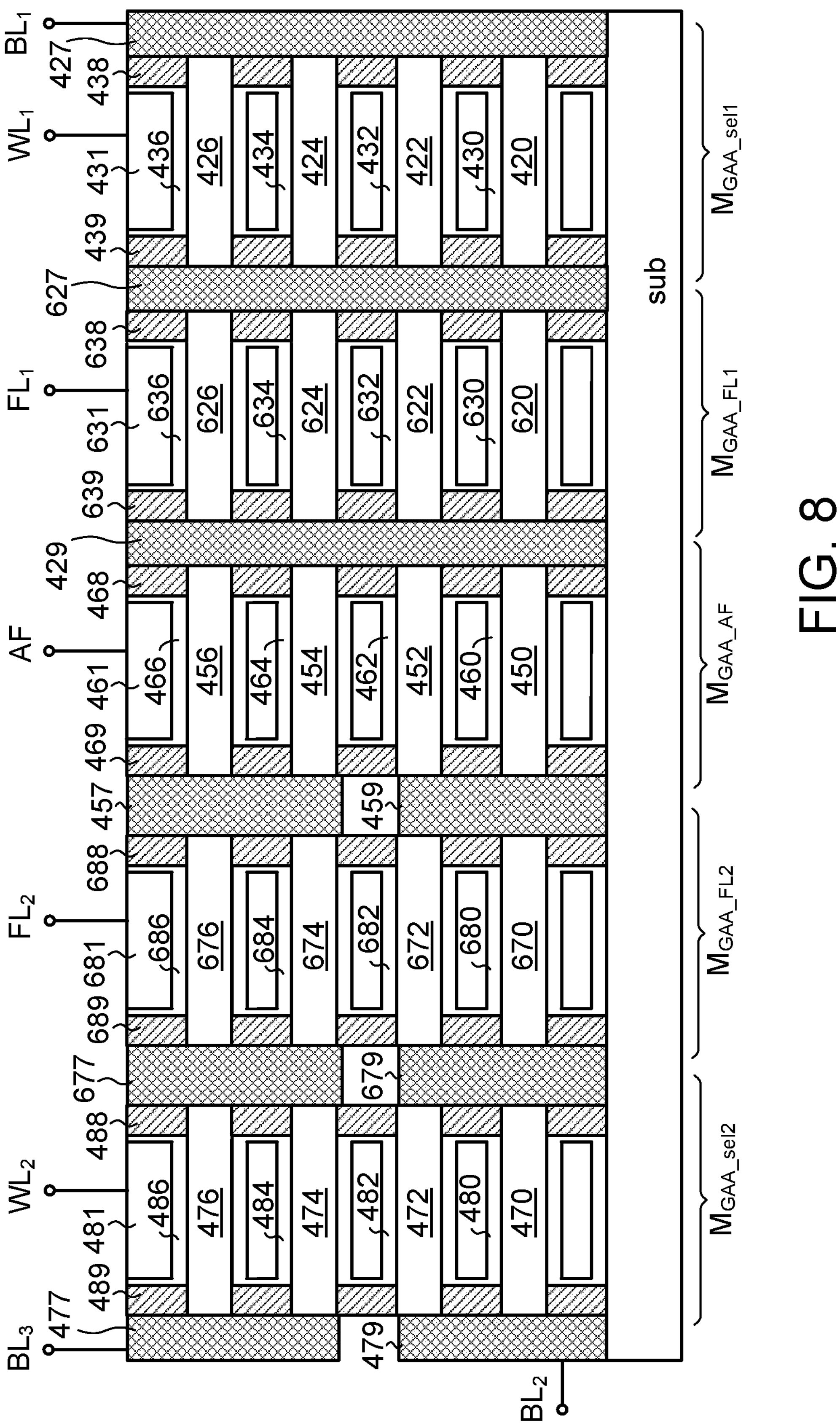
FIG. 8 is a schematic cross-sectional view illustrating the structure of an antifuse-type one time programming memory cell for a PUF technology according to a fourth embodiment of the present invention.

FIG. 8 is a schematic cross-sectional view illustrating the structure of an antifuse-type one time programming memory cell for a PUF technology according to a fourth embodiment of the present invention. In comparison with the OTP memory cell of the third embodiment, the OTP memory cell of the fourth embodiment further comprises a drain/source structure 457, a drain/source structure 477, a drain/source structure 677 and a third bit line $BL_3$. For succinctness, only the distinguished structures will be described as follows. The other structures of the OTP memory cell of this embodiment are similar to those of OTP memory cell as shown in FIG. 6, and not redundantly described herein.

In the OTP memory cell of the fourth embodiment, the drain/source structure 457 is electrically contacted with the second terminals of the nanowires 454 and 456 of the antifuse transistor $M_{GAA\_AF}$, and the drain/source structure 457 is also electrically contacted with the first terminals of the nanowires 674 and 676 of the second following transistor $M_{GAA\_FL2}$. The drain/source structure 677 is electrically contacted with the second terminals of the nanowires 674 and 676 of the second following transistor $M_{GAA\_FL2}$, and the drain/source structure 677 is electrically contacted with the first terminals of the nanowires 474 and 476 of the second select transistor $M_{GAA\_sel2}$. The drain/source structure 477 is electrically contacted with the second terminals of the nanowires 474 and 476 of the second select transistor $M_{GAA\_sel2}$. Moreover, the drain/source structure 477 is connected with the third bit line $BL_3$. In this embodiment, the drain/source structure 479 is electrically contacted with the second terminals of the nanowires 470 and 472 of the second select transistor $M_{GAA\_sel2}$. Moreover, the drain/source structure 479 is connected with the second bit line $BL_2$. The drain/source structure 677 is not electrically contacted with the drain/source structure 679. The drain/source structure 477 is not electrically contacted with the drain/source structure 479.

In the OTP memory cell of the fourth embodiment, the region between the first bit line $BL_1$ and the antifuse control line AF is an enroll path. When the first select transistor $M_{GAA\_sel1}$ and the first following transistor $M_{GAA\_FL1}$ are turned on, the enroll path is turned on. When the first select transistor $M_{GAA\_sel1}$ and the first following transistor $M_{GAA\_FL1}$ are turned off, the enroll path is turned off. In other words, the enroll path in the OTP memory cell of the fourth embodiment is identical to the enroll path in the OTP memory cell of the third embodiment.

The methods of performing the enroll action on the OTP memory cell of the fourth embodiment are similar to those of the third embodiment. That is, after the enroll action is completed, one of the four gate dielectric layers 460, 462, 464 and 466 of the antifuse transistor $M_{GAA\_AF}$ is ruptured. Due to the process variation of the OTP memory cell, it is unable to predict which of the gate dielectric layers 460, 462, 464 and 466 of the antifuse transistor $M_{GAA\_AF}$ is ruptured when the enroll action is performed. Consequently, the PUF technology can be applied to the antifuse-type OTP memory cell of the fourth embodiment.

In the OTP memory cell of the fourth embodiment, the region between the second bit line $BL_2$ and the antifuse control line AF is a first read path, and the region between the third bit line $BL_3$ and the antifuse control line AF is a second read path. When the second select transistor $M_{GAA\_sel2}$ and the second following transistor $M_{GAA\_FL2}$ are turned on, both of the first read path and the second read path are turned on. When the second select transistor $M_{GAA\_sel2}$ and the second following transistor $M_{GAA\_FL2}$ are turned off, both of the first read path and the second read path are turned off.

For example, when the read action is performed, the first bit line $BL_1$ is in the floating state, the first word line $WL_1$ is in the floating state, the first following control line $FL_1$ is in the floating state, the antifuse control line AF receives a read voltage $V_{RD}$, the second word line $WL_2$ receives the first on voltage $V_{ON1}$, the second following control line $FL_2$ receives the second on voltage $V_{ON2}$, the second bit line $BL_2$ receives the ground voltage (0V), and the third bit line $BL_3$ receives the ground voltage (0V). Under this circumstance, the second select transistor $M_{GAA\_sel2}$ and the second following transistor $M_{GAA\_FL2}$ are turned on, and the first select transistor $M_{GAA\_sel1}$ and the first following transistor $M_{GAA\_FL1}$ are turned off. That is, the first read path and the second read path are turned on, and the enroll path is turned off.

For example, if the gate dielectric layer 460 or the gate dielectric layer 462 of the antifuse transistor $M_{GAA\_AF}$ is ruptured, the first read path (i.e., the second bit line $BL_2$) generates a higher read current and the read current in the second read path (i.e., the third bit line $BL_3$) is very low (e.g., nearly zero) when the read action is performed. Whereas, if the gate dielectric layer 464 or the gate dielectric layer 466 of the antifuse transistor $M_{GAA\_AF}$ is ruptured, the read current in the second read path (i.e., the third bit line $BL_3$) generates a higher read current and the read current in the first read path (i.e., the second bit line $BL_2$) is very low (e.g., nearly zero) when the read action is performed.

As mentioned above, the read action is performed after the enroll action is completed. When the read action is performed, one bit of a random code can be determined according to the magnitude of the read current in the second bit line $BL_2$ and the magnitude of the read current in the third bit line $BL_3$.

Moreover, when the read action is performed, the OTP memory cell possibly generates a leakage current. The generation of the leakage current may influence the read result. Take the OTP memory cell of the first embodiment for example. As shown in FIG. 3D, the gate dielectric layer 466 of the antifuse transistor $M_{GAA\_AF}$ is ruptured. Theoretically, when the read action is performed, the magnitude of the read current on the second bit line $BL_2$ is nearly zero. Since the drain/source structure 429 is electrically contacted with the first terminal of the nanowire 456, the leakage current is possibly generated during the read action and transmitted to the second bit line $BL_2$ through the drain/source structure 429, the antifuse transistor $M_{GAA\_AF}$ and the second select transistor $M_{GAA\_sel2}$. Consequently, the read result is affected by the leakage current.

Figure 9A:
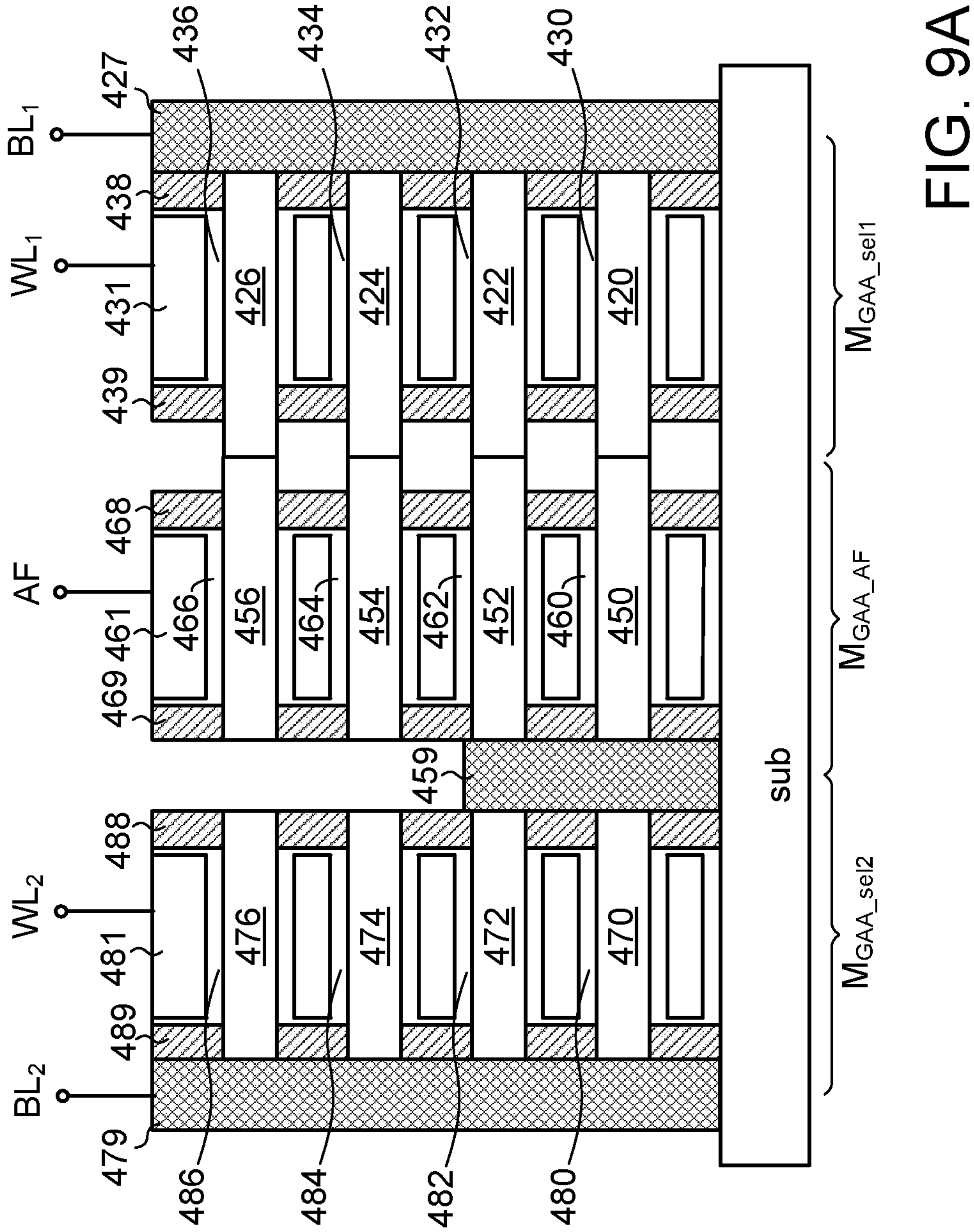
FIG. 9A is a schematic cross-sectional view illustrating the structure of an antifuse-type one time programming memory cell for a PUF technology according to a fifth embodiment of the present invention.

For solving the above drawbacks, the structure of the OTP memory in the first embodiment and shown in FIG. 2 is further modified. FIG. 9A is a schematic cross-sectional view illustrating the structure of an antifuse-type one time programming memory cell for a PUF technology according to a fifth embodiment of the present invention.

In comparison with the OTP memory cell of the first embodiment, the OTP memory cell of this embodiment is not equipped with the drain/source structure 429. That is, the second terminals of the nanowires 420, 422, 424 and 426 in the first select transistor $M_{GAA\_sel1}$ are in direct contact with the first terminals of the nanowires 450, 452, 454 and 456 in the antifuse transistor $M_{GAA\_AF}$, respectively. The other structures of the OTP memory cell of this embodiment are similar to those of OTP memory cell of the first embodiment, and not redundantly described herein.

Similarly, in a variant example of the OTP memory cell as shown in FIG. 4, the drain/source structure 538 is omitted. That is, the second terminals of the nanowires 510 and 512 in the first select transistor $M_{GAA\_sel1}$ are in direct contact with the first terminals of the nanowires 540 and 542 in the antifuse transistor $M_{GAA\_AF}$, respectively.

The methods of performing the enroll action and the read action on the OTP memory cell of the fifth embodiment are similar to those of the first embodiment, and not redundantly described herein.

In a variant example of the OTP memory cell of the fifth embodiment, the first select transistor $M_{GAA\_sel1}$ has 2 nanowires (X=2), the second select transistor $M_{GAA\_sel2}$ has 1 nanowire (Y=1), and the antifuse transistor $M_{GAA\_AF}$ has two nanowires (Z=2). Moreover, the two nanowires of the first select transistor $M_{GAA\_sel1}$ are in direct contact with the two nanowires of the antifuse transistor $M_{GAA\_AF}$, respectively. Due to this structural design, the antifuse-type OTP memory cell for the PUF technology has the smallest size.

Figure 9B:
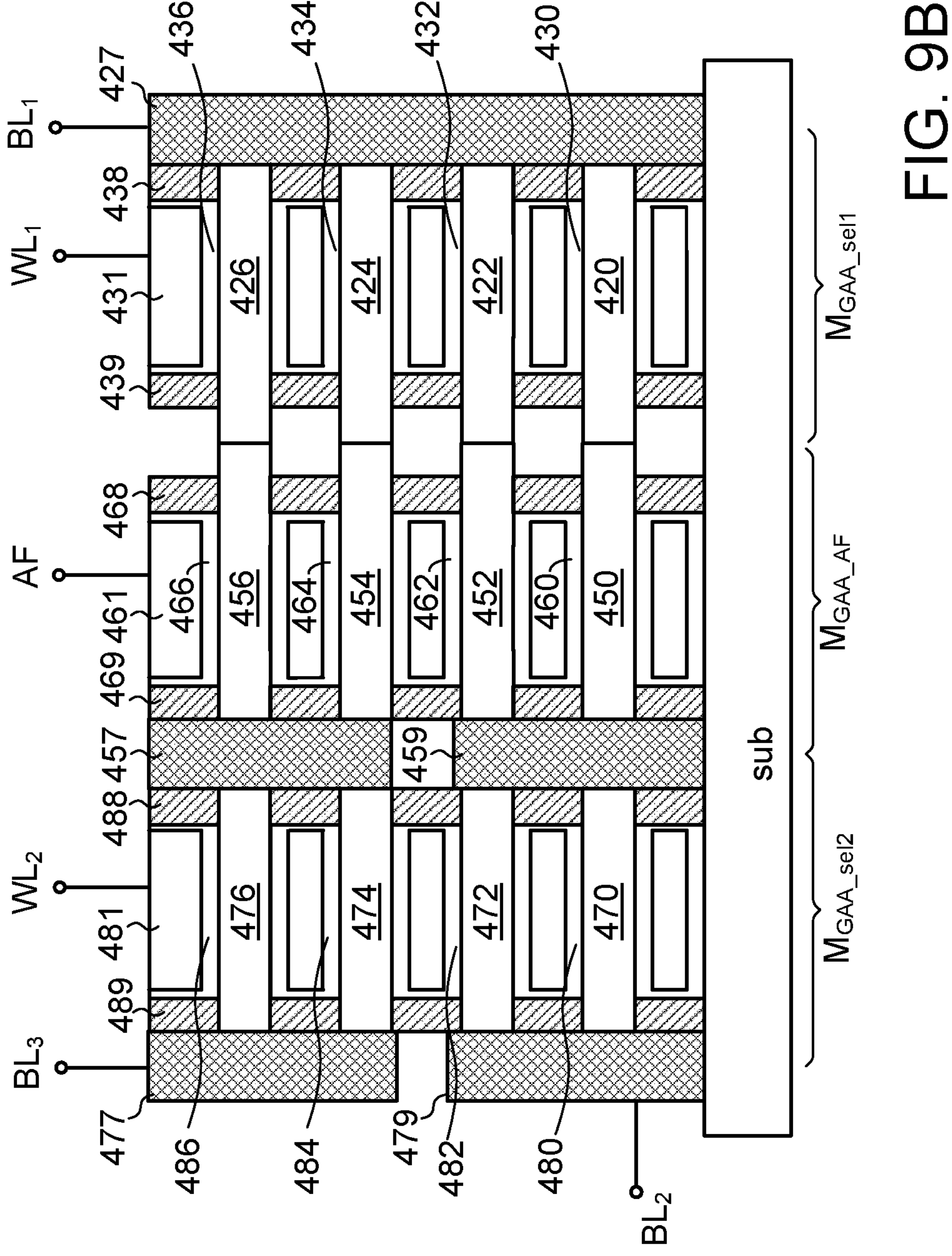
FIG. 9B is a schematic cross-sectional view illustrating another variant example of the OTP memory cell of the fifth embodiment.

As shown in FIG. 9B, in another variant example of the OTP memory cell of the fifth embodiment, the structure of the second select transistor $M_{GAA\_sel2}$ is similar to that of the OTP memory cell as shown in FIG. 5A and the drain/source structure 429 is omitted. That is, the second terminals of the nanowires 420, 422, 424 and 426 in the first select transistor $M_{GAA\_sel1}$ are in direct contact with the first terminals of the nanowires 450, 452, 454 and 456 in the antifuse transistor $M_{GAA\_AF}$, respectively. Taking the nanowire 450 contacted to the nanowire 420 in FIG. 9B as an example, the solid line between the nanowire 450 and the nanowire 420 is only used to represent the two terminals of the nanowire 450 and 420. The nanowires 450 and 420 can be regarded as one nanowire. Furthermore, the OTP memory cell of the variant example further comprises a third bit line $BL_3$. Moreover, the bias voltages for performing the read action on the OTP memory cell of the variant example are similar to those as shown in FIG. 5C.

Figure 10A:
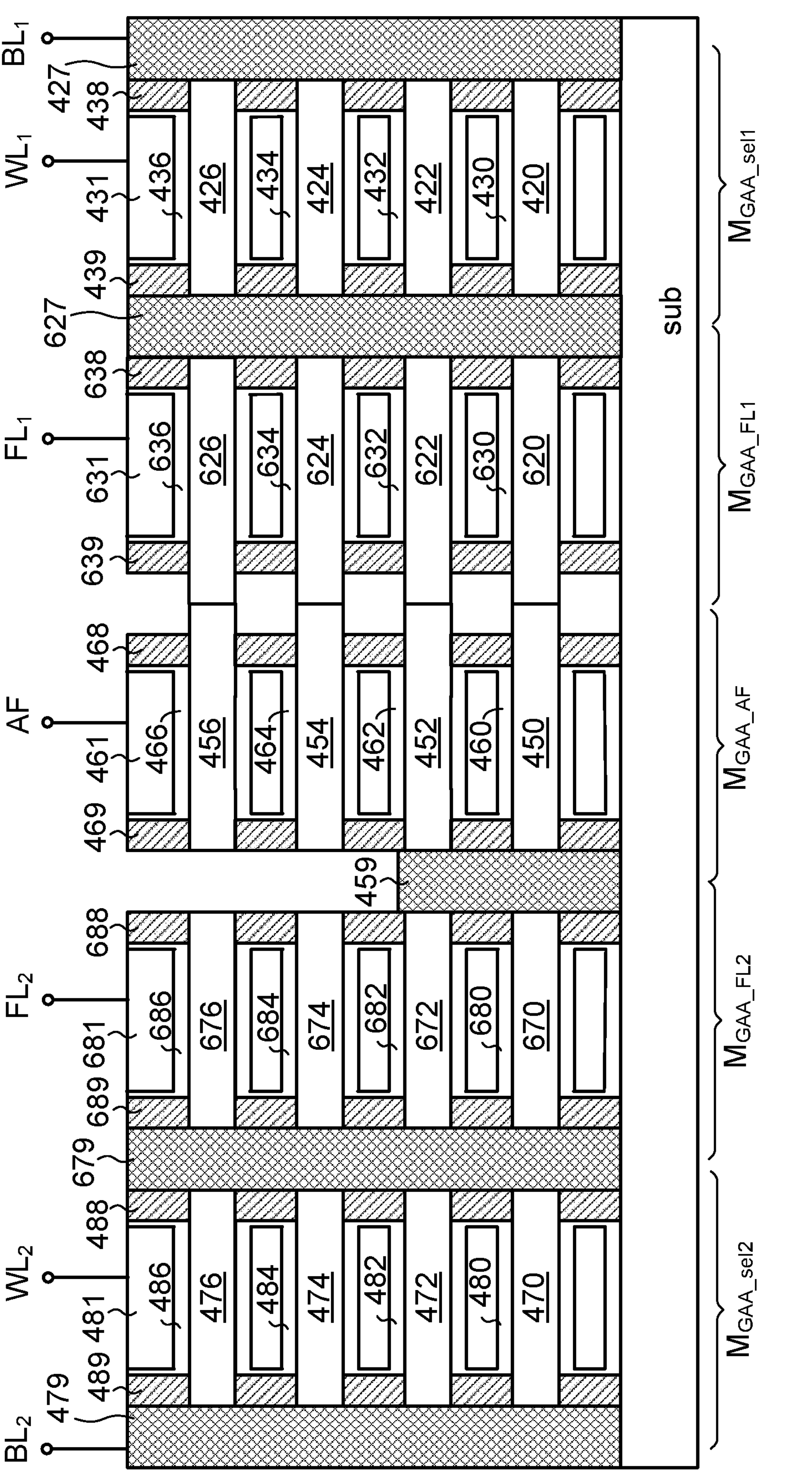
FIG. 10A is a schematic cross-sectional view illustrating the structure of an antifuse-type one time programming memory cell for a PUF technology according to a sixth embodiment of the present invention.

Moreover, the structure of the OTP memory in the third embodiment and shown in FIG. 6 is further modified. FIG. 10A is a schematic cross-sectional view illustrating the structure of an antifuse-type one time programming memory cell for a PUF technology according to a sixth embodiment of the present invention.

In comparison with the OTP memory cell of the third embodiment, the OTP memory cell of this embodiment is not equipped with the drain/source structure 429. That is, the second terminals of the nanowires 620, 622, 624 and 626 in the first following transistor $M_{GAA\_FL1}$ are in direct contact with the first terminals of the nanowires 450, 452, 454 and 456 in the antifuse transistor $M_{GAA\_AF}$, respectively. The other structures of the OTP memory cell of the sixth embodiment are similar to those of OTP memory cell of the third embodiment, and not redundantly described herein.

In a variant example of FIG. 10A, the drain/source structure 479 is electrically contacted with the two nanowires 470 and 472 only, but the drain/source structure 479 is not electrically contacted with the two nanowires 474 and 476. Similarly, the drain/source structure 679 is electrically contacted with the two nanowires 670 and 672 of the second following transistor $M_{GAA\_FL2}$ and the two nanowires 470 and 472 of the second select transistor $M_{GAA\_sel2}$ only, but the drain/source structure 679 is not electrically contacted with the two nanowires 674 and 676 of the second following transistor $M_{GAA\_FL2}$ and the two nanowires 474 and 476 of the second select transistor $M_{GAA\_sel2}$.

Similarly, in a variant example of the OTP memory cell as shown in FIG. 7, the drain/source structure 538 is omitted. That is, the second terminals of the nanowires 710 and 712 in the first following transistor $M_{GAA\_FL1}$ are in direct contact with the first terminals of the nanowires 540 and 542 in the antifuse transistor $M_{GAA\_AF}$, respectively.

The methods of performing the enroll action and the read action on the OTP memory cell of the sixth embodiment are similar to those of the third embodiment, and not redundantly described herein.

In a variant example of the OTP memory cell of the sixth embodiment, the first select transistor $M_{GAA\_sel1}$ has 1 nanowire (X=1), the second select transistor $M_{GAA\_sel2}$ has 1 nanowire (Y=1), the first following transistor $M_{GAA\_FL1}$ has 2 nanowires (V=2), the second following transistor $M_{GAA\_FL2}$ has 1 nanowire (W=1), and the antifuse transistor $M_{GAA\_AF}$ has two nanowires (Z=2). Moreover, the two nanowires of the first following transistor $M_{GAA\_FL1}$ are in direct contact with the two nanowires of the antifuse transistor $M_{GAA\_AF}$, respectively. Due to this structural design, the antifuse-type OTP memory cell for the PUF technology has the smallest size.

Figure 10B:
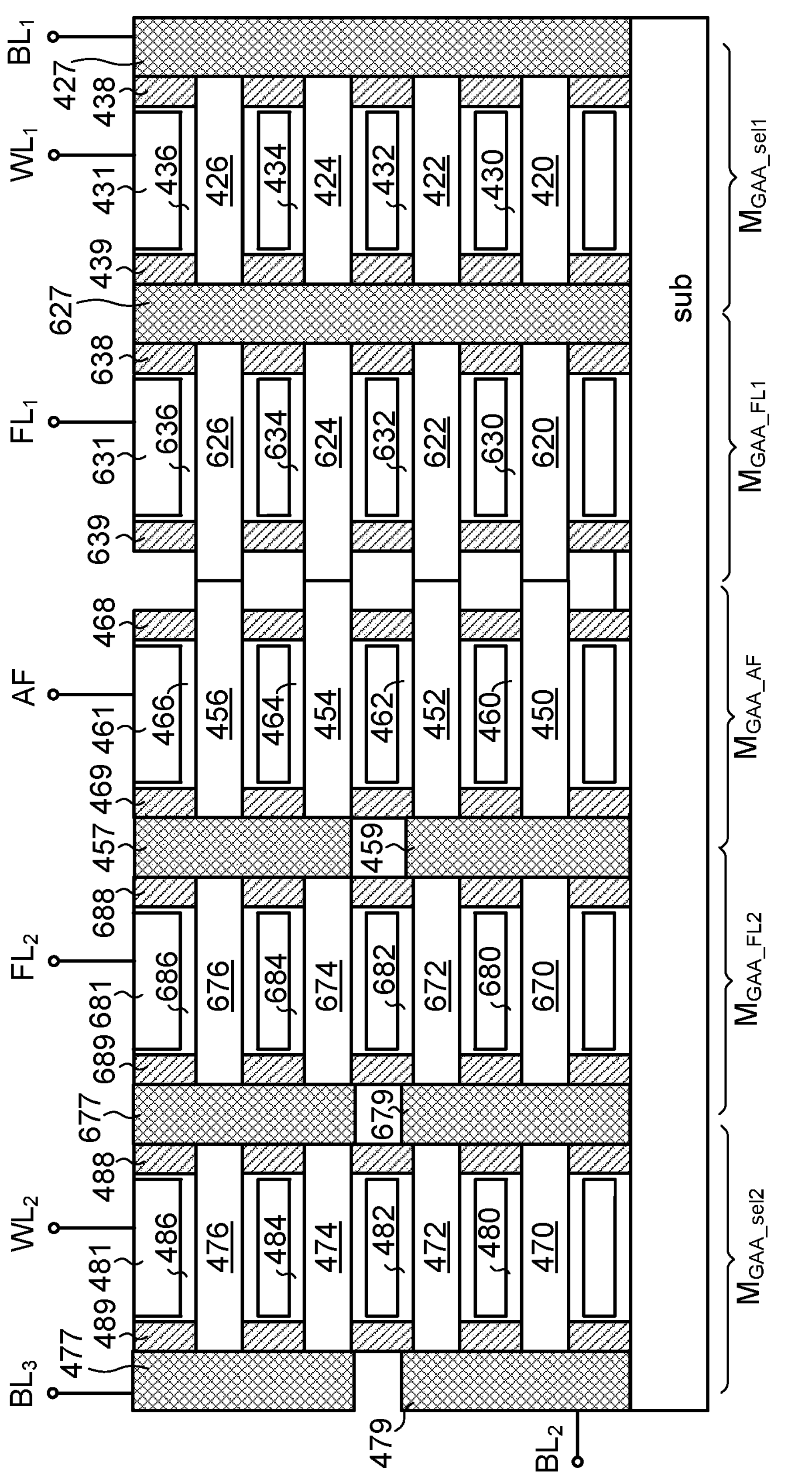
FIG. 10B is a schematic cross-sectional view illustrating another variant example of the OTP memory cell of the sixth embodiment.

As shown in FIG. 10B, in another variant example of the OTP memory cell of the sixth embodiment, the structure of the second select transistor $M_{GAA\_sel2}$ is similar to that of the OTP memory cell as shown in FIG. 8 and the drain/source structure 429 is omitted. That is, the second terminals of the nanowires 620, 622, 624 and 626 in the first following transistor $M_{GAA\_FL1}$ are in direct contact with the first terminals of the nanowires 450, 452, 454 and 456 in the antifuse transistor $M_{GAA\_AF}$, respectively. Furthermore, the OTP memory cell of the variant example embodiment further comprises a third bit line $BL_3$.

Figure 11A:
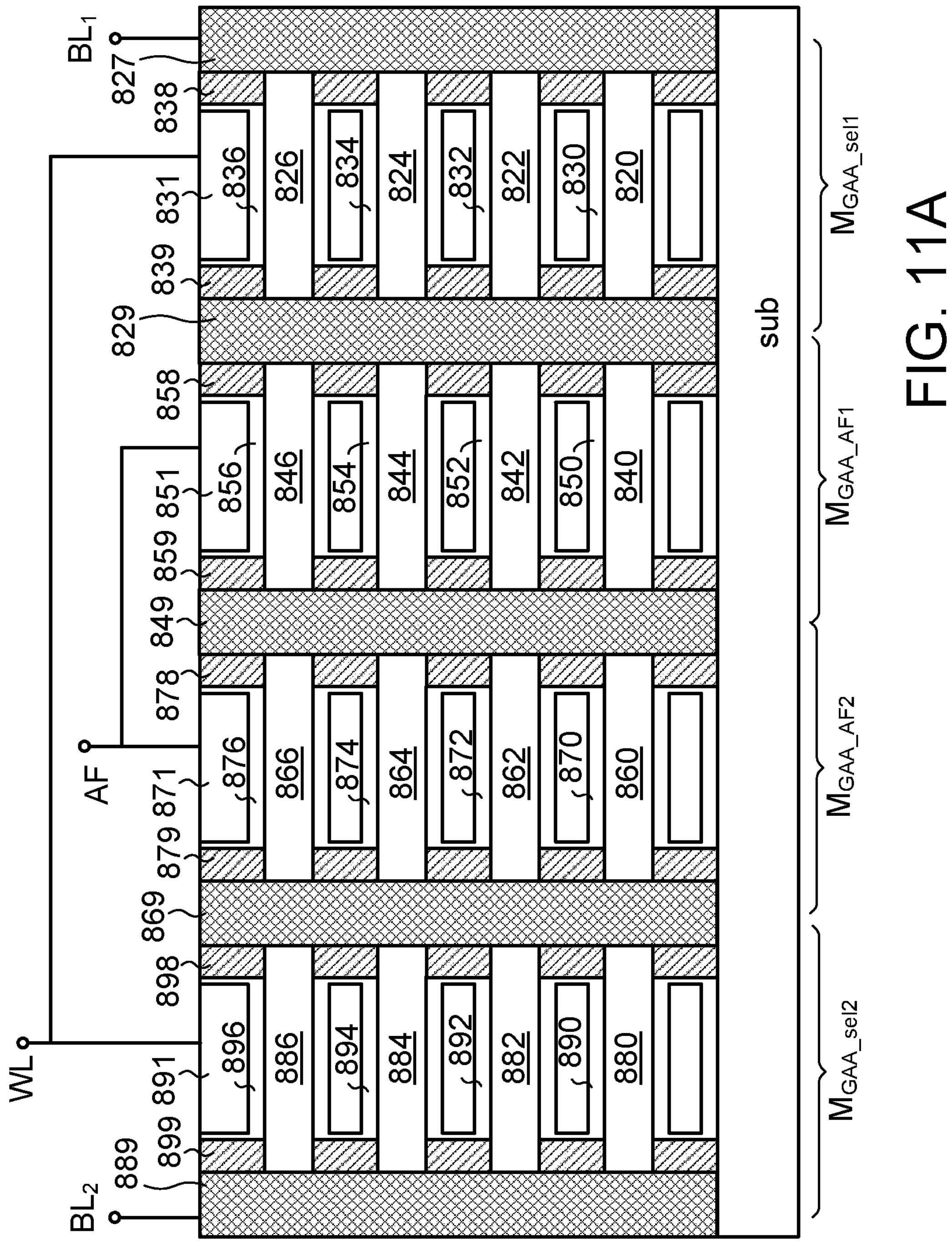
FIG. 11A is a schematic cross-sectional view illustrating the structure of an antifuse-type one time programming memory cell for a PUF technology according to a seventh embodiment of the present invention.

The present invention also provides an OTP differential cell with GAA transistors by for the PUF technology. FIG. 11A is a schematic cross-sectional view illustrating the structure of an antifuse-type one time programming memory cell for a PUF technology according to a seventh embodiment of the present invention. In this embodiment, the OTP memory cell comprises four GAA transistors. The structure of each of the four GAA transistors is similar to that of FIG. 1C, and not redundantly described herein. The four GAA transistors include a first select transistor $M_{GAA\_sel1}$, a second select transistor $M_{GAA\_sel2}$, a first antifuse transistor $M_{GAA\_AF1}$ and a second antifuse transistor $M_{GAA\_AF2}$. The first select transistor $M_{GAA\_sel1}$, the second select transistor $M_{GAA\_sel2}$, the first antifuse transistor $M_{GAA\_AF1}$ and the second antifuse transistor $M_{GAA\_AF2}$ are formed over the semiconductor substrate sub.

The first select transistor $M_{GAA\_sel1}$ comprises a drain/source structure 827, a drain/source structure 829, a gate structure and four nanowires 820, 822, 824 and 826. The gate structure is formed over the semiconductor sub. The gate structure comprises two spacers 838, 839, gate dielectric layers 830, 832, 834, 836 and a gate layer 831. The gate dielectric layer 830 surrounds the central region of the nanowire 820. The gate dielectric layer 832 surrounds the central region of the nanowire 822. The gate dielectric layer 834 surrounds the central region of the nanowire 824. The gate dielectric layer 836 surrounds the central region of the nanowire 826. The gate layer 831 surrounds the gate dielectric layers 830, 832, 834 and 836. The first side regions of the nanowires 820, 822, 824 and 826 are surrounded by the spacer 838. The second side regions of the nanowires 820, 822, 824 and 826 are surrounded by the spacer 839. The spacers 838 and 839 are formed on the semiconductor substrate sub. The nanowires 820, 822, 824 and 826 that are surrounded by the gate structure are nanowire channel regions of the first select transistor $M_{GAA\_sel1}$. The two drain/source structures 827 and 829 are respectively located on both sides of the gate structure. The drain/source structure 827 is electrically contacted with the first terminals of the nanowires 820, 822, 824 and 826. The drain/source structure 829 is electrically contacted with the second terminals of the nanowires 820, 822, 824 and 826. In an embodiment, the drain/source structure 827, the drain/source structure 829 and the nanowires 820, 822, 824 and 826 may have the same dopant type.

The first antifuse transistor $M_{GAA\_AF1}$ comprises the drain/source structure 829, a drain/source structure 849, a gate structure and four nanowires 840, 842, 844 and 846. The gate structure is formed over the semiconductor sub. The gate structure comprises two spacers 858, 859, gate dielectric layers 850, 852, 854, 856 and a gate layer 851. The gate dielectric layer 850 surrounds the central region of the nanowire 840. The gate dielectric layer 852 surrounds the central region of the nanowire 842. The gate dielectric layer 854 surrounds the central region of the nanowire 844. The gate dielectric layer 856 surrounds the central region of the nanowire 846. The gate layer 851 surrounds the gate dielectric layers 850, 852, 854 and 856. The first side regions of the nanowires 840, 842, 844 and 846 are surrounded by the spacer 858. The second side regions of the nanowires 840, 842, 844 and 846 are surrounded by the spacer 859. The spacers 858 and 859 are formed on the semiconductor substrate sub. The nanowires 840, 842, 844 and 846 that are surrounded by the gate structure are nanowire channel regions of the first antifuse transistor $M_{GAA\_AF1}$. The two drain/source structures 829 and 849 are respectively located on both sides of the gate structure. The drain/source structure 829 is electrically contacted with the first terminals of the nanowires 840, 842, 844 and 846. The drain/source structure 849 is electrically contacted with the second terminals of the nanowires 840, 842, 844 and 846. In an embodiment, the drain/source structure 829, the drain/source structure 849 and the nanowires 840, 842, 844 and 846 may have the same dopant type.

The second antifuse transistor $M_{GAA\_AF2}$ comprises the drain/source structure 849, a drain/source structure 869, a gate structure and four nanowires 860, 862, 864 and 866. The gate structure is formed over the semiconductor sub. The gate structure comprises two spacers 878, 879, gate dielectric layers 870, 872, 874, 876 and a gate layer 871. The gate dielectric layer 870 surrounds the central region of the nanowire 860. The gate dielectric layer 872 surrounds the central region of the nanowire 862. The gate dielectric layer 874 surrounds the central region of the nanowire 864. The gate dielectric layer 876 surrounds the central region of the nanowire 866. The gate layer 871 surrounds the gate dielectric layers 870, 872, 874 and 876. The first side regions of the nanowires 860, 862, 864 and 866 are surrounded by the spacer 878. The second side regions of the nanowires 860, 862, 864 and 866 are surrounded by the spacer 879. The spacers 878 and 879 are formed on the semiconductor substrate sub. The nanowires 860, 862, 864 and 866 that are surrounded by the gate structure are nanowire channel regions of the second antifuse transistor $M_{GAA\_AF2}$. The two drain/source structures 849 and 869 are respectively located on both sides of the gate structure. The drain/source structure 849 is electrically contacted with the first terminals of the nanowires 860, 862, 864 and 866. The drain/source structure 869 is electrically contacted with the second terminals of the nanowires 860, 862, 864 and 866. In an embodiment, the drain/source structure 849, the drain/source structure 869 and the nanowires 860, 862, 864 and 866 may have the same dopant type.

The second select transistor $M_{GAA\_sel2}$ comprises the drain/source structure 869, a drain/source structure 889, a gate structure and four nanowires 880, 882, 884 and 886. The gate structure is formed over the semiconductor sub. The gate structure comprises two spacers 898, 899, gate dielectric layers 890, 892, 894, 896 and a gate layer 891. The gate dielectric layer 890 surrounds the central region of the nanowire 880. The gate dielectric layer 892 surrounds the central region of the nanowire 882. The gate dielectric layer 894 surrounds the central region of the nanowire 884. The gate dielectric layer 896 surrounds the central region of the nanowire 886. The gate layer 891 surrounds the gate dielectric layers 890, 892, 894 and 896. The first side regions of the nanowires 880, 882, 884 and 886 are surrounded by the spacer 898. The second side regions of the nanowires 880, 882, 884 and 886 are surrounded by the spacer 899. The spacers 898 and 899 are formed on the semiconductor substrate sub. The nanowires 880, 882, 884 and 886 that are surrounded by the gate structure are nanowire channel regions of the second select transistor $M_{GAA\_sel2}$. The two drain/source structures 869 and 889 are respectively located on both sides of the gate structure. The drain/source structure 869 is electrically contacted with the first terminals of the nanowires 880, 882, 884 and 886. The drain/source structure 889 is electrically contacted with the second terminals of the nanowires 880, 882, 884 and 886. In an embodiment, the drain/source structure 869, the drain/source structure 889 and the nanowires 880, 882, 884 and 886 may have the same dopant type.

In the first select transistor $M_{GAA\_sel1}$, the drain/source structure 827 is connected with a first bit line $BL_1$, and the gate layer 831 is connected with a word line WL. In the first antifuse transistor $M_{GAA\_AF1}$, the gate layer 851 is connected with an antifuse control line AF. In the second antifuse transistor $M_{GAA\_AF2}$, the gate layer 871 is connected with the antifuse control line AF. In the second select transistor $M_{GAA\_sel2}$, the drain/source structure 889 is connected with a second bit line $BL_2$, and the gate layer 891 is connected with the word line WL.

Figure 11B:
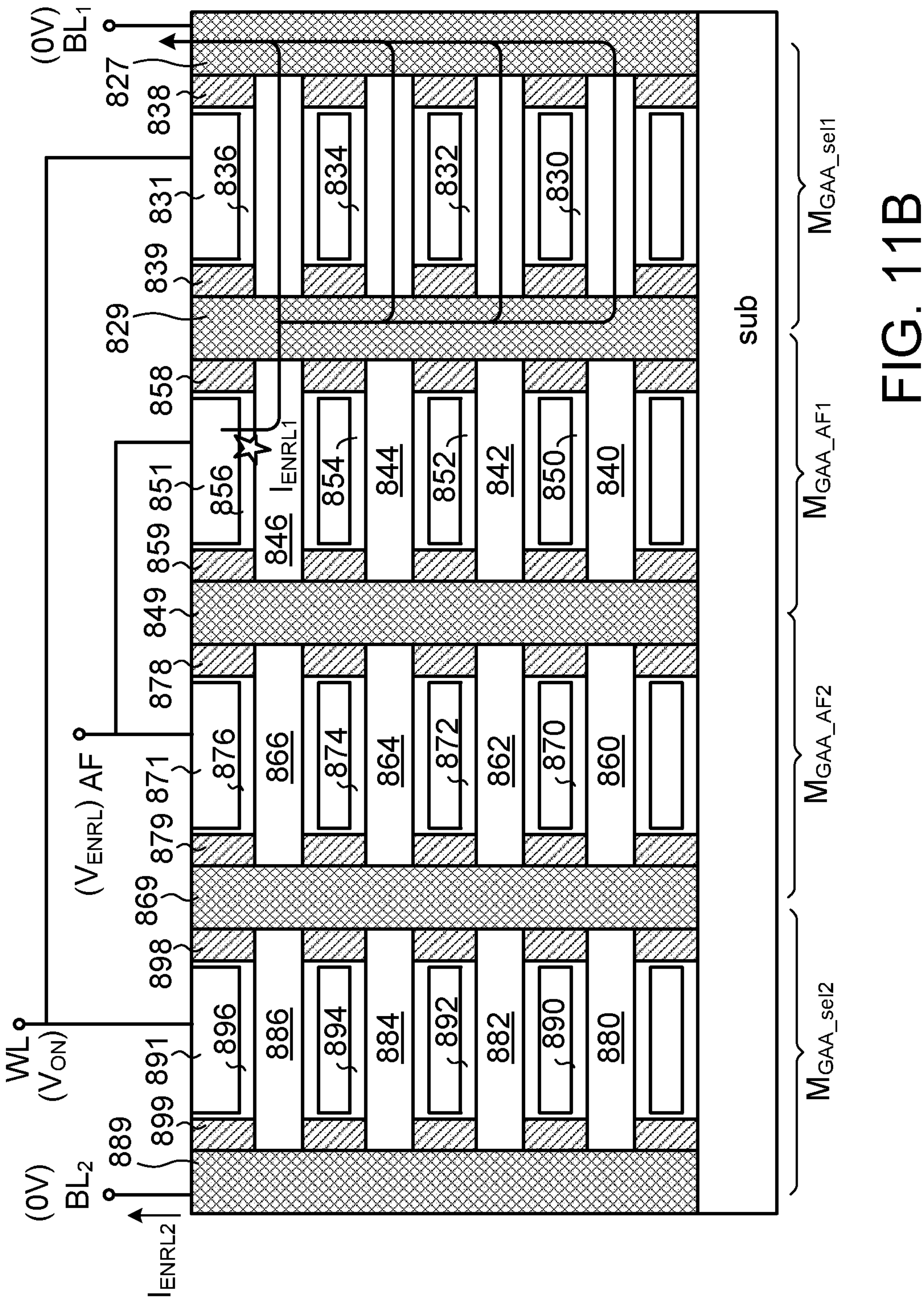
FIG. 11B schematically illustrates associated bias voltages for performing an enroll action on the antifuse-type OTP memory cell according to the seventh embodiment of the present invention.

FIG. 11B schematically illustrates associated bias voltages for performing an enroll action on the antifuse-type OTP memory cell according to the seventh embodiment of the present invention. When the enroll action is performed, the region between the antifuse control line AF and the first bit line $BL_1$ is a first enroll path, and the antifuse control line AF and the second bit line $BL_2$ is a second enroll path. Moreover, when the enroll action is performed, the first bit line $BL_1$ receives a ground voltage (0V), the word line WL receives an on voltage VON, the antifuse control line AF receives an enroll voltage $V_{ENRL}$, and the second bit line $BL_2$ receives the ground voltage (0V). For example, the enroll voltage $V_{ENRL}$ is in the range between 3V and 6V, and the on voltage VON is in the range between 0.4V and 3V. Under this circumstance, the first select transistor $M_{GAA\_sel1}$ and the second select transistor $M_{GAA\_sel1}$ are turned on. That is, the first enroll path and the second enroll path are turned on.

Since the first select transistor $M_{GAA\_sel1}$ is turned on, the ground voltage (0V) of the first bit line $BL_1$ is transmitted to the drain/source structure 829 and the nanowires 840, 842, 844 and 846 of the first antifuse transistor $M_{GAA\_AF1}$ through the first select transistor $M_{GAA\_sel1}$. Moreover, since the second select transistor $M_{GAA\_sel2}$ is turned on, the ground voltage (0V) of the second bit line $BL_2$ is transmitted to the drain/source structure 869 and the nanowires 860, 862, 864 and 866 of the second antifuse transistor $M_{GAA\_AF2}$ through the second select transistor $M_{GAA\_sel2}$. Consequently, when the antifuse control line AF receives the enroll voltage $V_{ENRL}$, the voltage stress between the nanowires 840, 842, 844 and 846 and the gate layer 851 of the first antifuse transistor $M_{GAA\_AF1}$ is equal to the enroll voltage $V_{ENRL}$. Moreover, the voltage stress between the nanowires 860, 862, 864 and 866 and the gate layer 871 of the second antifuse transistor $M_{GAA\_AF2}$ is equal to the enroll voltage $V_{ENRL}$. Under this circumstance, one of the eight gate dielectric layers 850, 852, 854, 856, 870, 872, 874 and 876 is ruptured.

Due to the process variation of the OTP memory cell, it is unable to predict which of the gate dielectric layers 850, 852, 854, 856, 870, 872, 874 and 876 of the first antifuse transistor $M_{GAA\_AF1}$ and the second antifuse transistor $M_{GAA\_AF2}$ is ruptured when the enroll action is performed. Consequently, the PUF technology can be applied to the antifuse-type OTP memory cell of the seventh embodiment.

For example, in the OTP memory cell as shown in FIG. 11B, the gate dielectric layer 856 of the first antifuse transistor $M_{GAA\_AF1}$ is ruptured after the enroll action is completed. Consequently, a first enroll current $I_{ENRL1}$ is generated. The first enroll current $I_{ENRL1}$ flows from the antifuse control line AF to the first bit line $BL_1$ through the gate layer 851, the gate dielectric layer 856, the nanowire 846, the drain/source structure 829 and the first select transistor $M_{GAA\_sel1}$. Since the gate dielectric layer 856 is ruptured, the region between the gate layer 851 and the nanowire 846 has a low resistance value. Moreover, since the gate dielectric layers 870, 872, 874 and 876 of the second antifuse transistor $M_{GAA\_AF2}$ are not ruptured, a second enroll current $I_{ENRL2}$ in the second bit line $BL_2$ is very low (e.g., nearly zero).

Similarly, if one of the other gate dielectric layers 850, 852 and 854 of the first antifuse transistor $M_{GAA\_AF1}$ is ruptured when the enroll action is performed, the magnitude of the first enroll current $I_{ENRL1}$ in the first bit line $BL_1$ is higher than the magnitude of the second enroll current $I_{ENRL2}$ in the second bit line $BL_2$. Whereas, if one of the gate dielectric layers 870, 872, 874 and 876 of the second antifuse transistor $M_{GAA\_AF2}$ is ruptured when the enroll action is performed, the magnitude of the second enroll current $I_{ENRL2}$ in the second bit line $BL_2$ is higher than the magnitude of the first enroll current $I_{ENRL1}$ in the first bit line $BL_1$.

Figure 11C:
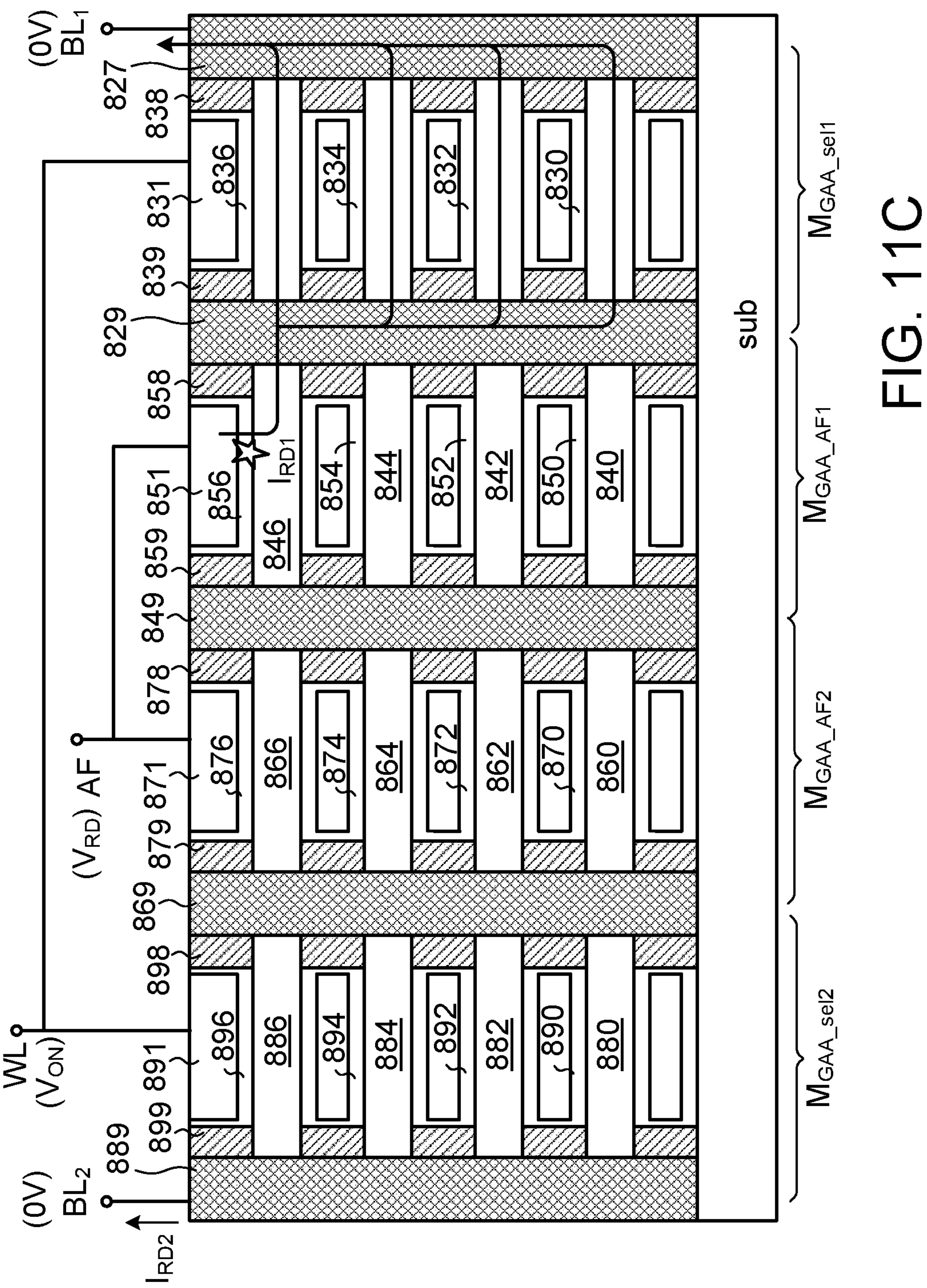
FIG. 11C schematically illustrates associated bias voltages for performing a read action on the antifuse-type OTP memory cell according to the seventh embodiment of the present invention.

FIG. 11C schematically illustrates associated bias voltages for performing a read action on the antifuse-type OTP memory cell according to the seventh embodiment of the present invention. When the read action is performed, the region between the antifuse control line AF and the first bit line $BL_1$ is a first read path, and the antifuse control line AF and the second bit line $BL_2$ is a second read path. Moreover, when the read action is performed, the first bit line $BL_1$ receives a ground voltage (0V), the word line WL receives an on voltage VON, the antifuse control line AF receives a read voltage $V_{RD}$, and the second bit line $BL_2$ receives the ground voltage (0V). For example, the read voltage $V_{RD}$ is in the range between 0.75V and 1.2V. Under this circumstance, the first select transistor $M_{GAA\_sel1}$ and the second select transistor $M_{GAA\_sel2}$ are turned on. That is, the first read path and the second read path are turned on.

For example, in the OTP memory cell as shown in FIG. 11C, the gate dielectric layer 856 of the first antifuse transistor $M_{GAA\_AF1}$ is ruptured. When the read action is performed, a higher first read current $I_{RD1}$ flows from the antifuse control line AF to the first bit line $BL_1$ through the gate layer 851, the gate dielectric layer 856, the nanowire 846, the drain/source structure 829 and the first select transistor $M_{GAA\_sel1}$. Moreover, since the gate dielectric layers 870, 872, 874 and 876 of the second antifuse transistor $M_{GAA\_AF2}$ are not ruptured, a second read current $I_{RD2}$ in the second bit line $BL_2$ is very low (e.g., nearly zero).

That is, if one of the other gate dielectric layers 850, 852, 854 and 856 of the first antifuse transistor $M_{GAA\_AF1}$ is ruptured when the read action is performed, the magnitude of the first read current $I_{RD1}$ in the first bit line $BL_1$ is higher than the magnitude of the second read current $I_{RD2}$ in the second bit line $BL_2$. Whereas, if one of the gate dielectric layers 870, 872, 874 and 876 of the second antifuse transistor $M_{GAA\_AF2}$ is ruptured when the read action is performed, the magnitude of the second read current $I_{RD2}$ in the second bit line $BL_2$ is higher than the magnitude of the first read current $I_{RD1}$ in the first bit line $BL_1$.

As mentioned above, the read action is performed after the enroll action is completed. When the read action is performed, one bit of a random code can be determined according to the magnitude of the first read current $I_{RD1}$ in the first bit line $BL_1$ and the magnitude of the second read current $I_{RD2}$ in the second bit line $BL_2$. For example, a current comparator is provided. The current comparator receives the first read current $I_{RD1}$ and the second read current $I_{RD2}$. If the magnitude of the first read current $I_{RD1}$ is higher than the magnitude of the second read current $I_{RD2}$, a first logic value (e.g., "0") is determined as the random code. Whereas, if the magnitude of the first read current $I_{RD1}$ is lower than the magnitude of the second read current $I_{RD2}$, a second logic value (e.g., "1") is determined as the random code.

In a variant example of the OTP memory cell of the seventh embodiment, each of the four transistors has the structure of the GAA transistor as shown in FIG. 1E. For succinctness, the detailed description is omitted herein. In the OTP memory cell of the seventh embodiment, each of the first select transistor $M_{GAA\_sel1}$, the second select transistor $M_{GAA\_sel2}$, the first antifuse transistor $M_{GAA\_AF1}$ and the second antifuse transistor $M_{GAA\_AF2}$ has four nanowires. It is noted that numerous modifications and alterations may be made while retaining the teachings of the invention. For example, in some other embodiments, the first select transistor $M_{GAA\_sel1}$ has X nanowires, the second select transistor $M_{GAA\_sel2}$ has Y nanowires, the first antifuse transistor $M_{GAA\_AF1}$ has P nanowires, and the second antifuse transistor $M_{GAA\_AF2}$ has Q nanowires.

For example, in a variant example of the OTP memory cell of the seventh embodiment, the first select transistor $M_{GAA\_sel1}$ has 1 nanowire (X=1), the second select transistor $M_{GAA\_sel2}$ has 1 nanowire (Y=1), the first antifuse transistor $M_{GAA\_AF1}$ has 1 nanowire (P=1), and the second antifuse transistor $M_{GAA\_AF2}$ has 1 nanowire (Q=1). Due to this structural design, the antifuse-type OTP memory cell for the PUF technology has the smallest size.

Figure 12:
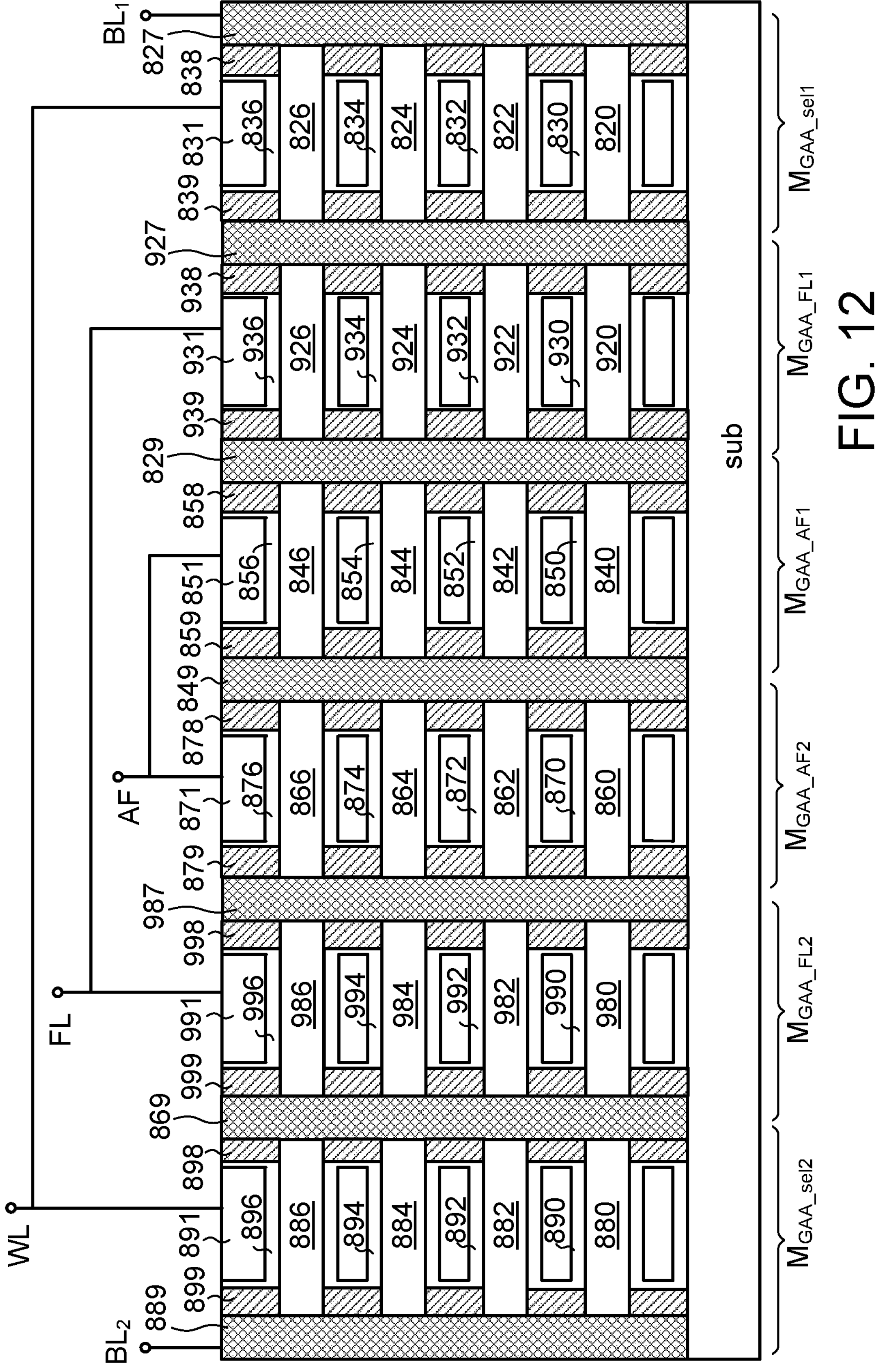
FIG. 12 is a schematic cross-sectional view illustrating the structure of an antifuse-type one time programming memory cell for a PUF technology according to an eighth embodiment of the present invention.

FIG. 12 is a schematic cross-sectional view illustrating the structure of an antifuse-type one time programming memory cell for a PUF technology according to an eighth embodiment of the present invention. In this embodiment, the OTP memory cell comprises six GAA transistors. The structure of each of the six GAA transistors is similar to that of FIG. 10, and not redundantly described herein. The sixth GAA transistors include a first select transistor $M_{GAA\_sel1}$, a second select transistor $M_{GAA\_sel2}$, a first following transistor $M_{GAA\_FL1}$, a second following transistor $M_{GAA\_FL2}$, a first antifuse transistor $M_{GAA\_AF1}$ and a second antifuse transistor $M_{GAA\_AF2}$.

In comparison with the OTP memory cell of the seventh embodiment, the OTP memory cell of the eighth embodiment further comprises the first following transistor $M_{GAA\_FL1}$ and the second following transistor $M_{GAA\_FL2}$. The first following transistor $M_{GAA\_FL1}$ is arranged between the first antifuse transistor $M_{GAA\_AF1}$ and the first select transistor $M_{GAA\_sel1}$. The second following transistor $M_{GAA\_FL2}$ is arranged between the second antifuse transistor $M_{GAA\_AF2}$ and the second select transistor $M_{GAA\_sel1}$.

The structures of the first select transistor $M_{GAA\_sel1}$, the second select transistor $M_{GAA\_sel2}$, the first antifuse transistor $M_{GAA\_AF1}$ and the second antifuse transistor $M_{GAA\_AF2}$ are similar to those of the OTP memory cell of the seventh embodiment. For succinctness, only the structures of the first following transistor $M_{GAA\_FL1}$ and the second following transistor $M_{GAA\_FL2}$ will be described as follows.

The first following transistor $M_{GAA\_FL1}$ comprises a drain/source structure 927, the drain/source structure 829, a gate structure and four nanowires 920, 922, 924 and 926. The gate structure is formed over the semiconductor sub. The gate structure comprises two spacers 938, 939, gate dielectric layers 930, 932, 934, 936 and a gate layer 931. The gate dielectric layer 930 surrounds the central region of the nanowire 920. The gate dielectric layer 932 surrounds the central region of the nanowire 922. The gate dielectric layer 934 surrounds the central region of the nanowire 924. The gate dielectric layer 936 surrounds the central region of the nanowire 926. The gate layer 931 surrounds the gate dielectric layers 930, 932, 934 and 936. The first side regions of the nanowires 920, 922, 924 and 926 are surrounded by the spacer 938. The second side regions of the nanowires 920, 922, 924 and 926 are surrounded by the spacer 939. The spacers 938 and 939 are formed on the semiconductor substrate sub. The nanowires 920, 922, 924 and 926 that are surrounded by the gate structure are nanowire channel regions of the first following transistor $M_{GAA\_FL1}$. The two drain/source structures 927 and 829 are respectively located on both sides of the gate structure. The drain/source structure 927 is electrically contacted with the first terminals of the nanowires 920, 922, 924 and 926. The drain/source structure 829 is electrically contacted with the second terminals of the nanowires 920, 922, 924 and 926. In an embodiment, the drain/source structure 927, the drain/source structure 829 and the nanowires 920, 922, 924 and 926 may have the same dopant type.

The second following transistor $M_{GAA\_FL2}$ comprises the drain/source structure 987, the drain/source structure 869, a gate structure and four nanowires 980, 982, 984 and 986. The gate structure is formed over the semiconductor sub. The gate structure comprises two spacers 998, 999, gate dielectric layers 990, 992, 994, 996 and a gate layer 991. The gate dielectric layer 990 surrounds the central region of the nanowire 980. The gate dielectric layer 992 surrounds the central region of the nanowire 982. The gate dielectric layer 994 surrounds the central region of the nanowire 984. The gate dielectric layer 996 surrounds the central region of the nanowire 986. The gate layer 991 surrounds the gate dielectric layers 990, 992, 994 and 996. The first side regions of the nanowires 980, 982, 984 and 986 are surrounded by the spacer 998. The second side regions of the nanowires 980, 982, 984 and 986 are surrounded by the spacer 999. The spacers 998 and 999 are formed on the semiconductor substrate sub. The nanowires 980, 982, 984 and 986 that are surrounded by the gate structure are nanowire channel regions of the second following transistor $M_{GAA\_FL2}$. The two drain/source structures 987 and 869 are respectively located on both sides of the gate structure. The drain/source structure 987 is electrically contacted with the second terminals of the nanowires 980, 982, 984 and 986. The drain/source structure 869 is electrically contacted with the second terminals of the nanowires 980, 982, 984 and 986. In an embodiment, the drain/source structure 987, the drain/source structure 869 and the nanowires 980, 982, 984 and 986 may have the same dopant type. In the first following transistor $M_{GAA\_FL1}$, the gate layer 931 is connected with a following control line FL. In the second following transistor $M_{GAA\_FL2}$, the gate layer 991 is also connected with the following control line FL.

When the enroll action is performed, the first bit line $BL_1$ receives a ground voltage (0V), the word line WL receives a first on voltage $V_{ON1}$, the following control line FL receives a second on voltage $V_{ON2}$, the antifuse control line AF receives an enroll voltage $V_{ENRL}$, and the second bit line $BL_2$ receives the ground voltage (0V). For example, the enroll voltage $V_{ENRL}$ is in the range between 3V and 6V, the first on voltage $V_{ON1}$ is in the range between 0.4V and 3V, and the second on voltage $V_{ON2}$ is in the range between 0.4V and 3V. Under this circumstance, the first select transistor $M_{GAA\_sel1}$, the second select transistor $M_{GAA\_sel2}$, the first following transistor $M_{GAA\_FL1}$ and the second following transistor $M_{GAA\_FL2}$ are turned on. That is, the first enroll path and the second enroll path are turned on.

In the first enroll path, the first select transistor $M_{GAA\_sel1}$ and the first following transistor $M_{GAA\_FL1}$ are turned on. Consequently, the ground voltage (0V) of the first bit line $BL_1$ is transmitted to the drain/source structure 829 and the nanowires 840, 842, 844 and 846 of the first antifuse transistor $M_{GAA\_AF1}$ through the first select transistor $M_{GAA\_sel1}$ and the first following transistor $M_{GAA\_FL1}$. In the second enroll path, the second select transistor $M_{GAA\_sel2}$ and the second following transistor $M_{GAA\_FL2}$ are turned on. Consequently, the ground voltage (0V) of the second bit line $BL_2$ is transmitted to the drain/source structure 869 and the nanowires 860, 862, 864 and 866 of the second antifuse transistor $M_{GAA\_AF2}$ through the second select transistor $M_{GAA\_sel2}$ and the second following transistor $M_{GAA\_FL2}$. Consequently, when the antifuse control line AF receives the enroll voltage $V_{ENRL}$, the voltage stress between the nanowires 840, 842, 844 and 846 and the gate layer 851 of the first antifuse transistor $M_{GAA\_AF1}$ is equal to the enroll voltage $V_{ENRL}$. Moreover, the voltage stress between the nanowires 860, 862, 864 and 866 and the gate layer 871 of the second antifuse transistor $M_{GAA\_AF2}$ is equal to the enroll voltage $V_{ENRL}$. Under this circumstance, one of the eight gate dielectric layers 850, 852, 854, 856, 870, 872, 874 and 876 is ruptured.

Due to the process variation of the OTP memory cell, it is unable to predict which of the gate dielectric layers 850, 852, 854, 856, 870, 872, 874 and 876 of the first antifuse transistor $M_{GAA\_AF1}$ and the second antifuse transistor $M_{GAA\_AF2}$ is ruptured when the enroll action is performed. Consequently, the PUF technology can be applied to the antifuse-type OTP memory cell of the eighth embodiment.

For example, if one of the gate dielectric layers 850, 852, 854 and 856 of the first antifuse transistor $M_{GAA\_AF1}$ is ruptured when the enroll action is performed, the magnitude of the first enroll current $I_{ENRL1}$ in the first bit line $BL_1$ is higher than the magnitude of the second enroll current $I_{ENRL2}$ in the second bit line $BL_2$. Whereas, if one of the gate dielectric layers 870, 872, 874 and 876 of the second antifuse transistor $M_{GAA\_AF2}$ is ruptured when the enroll action is performed, the magnitude of the second enroll current $I_{ENRL2}$ in the second bit line $BL_2$ is higher than the magnitude of the first enroll current $I_{ENRL1}$ in the first bit line $BL_1$.

When the read action is performed, the first read path and the second read path are turned on. For example, if one of the other gate dielectric layers 850, 852, 854 and 856 of the first antifuse transistor $M_{GAA\_AF1}$ is ruptured when the read action is performed, the magnitude of the first read current $I_{RD1}$ in the first bit line $BL_1$ is higher than the magnitude of the second read current $I_{RD2}$ in the second bit line $BL_2$. Whereas, if one of the gate dielectric layers 870, 872, 874 and 876 of the second antifuse transistor $M_{GAA\_AF2}$ is ruptured when the read action is performed, the magnitude of the second read current $I_{RD2}$ in the second bit line $BL_2$ is higher than the magnitude of the first read current $I_{RD1}$ in the first bit line $BL_1$.

As mentioned above, the read action is performed after the enroll action is completed. When the read action is performed, one bit of a random code can be determined according to the magnitude of the first read current $I_{RD1}$ in the first bit line $BL_1$ and the magnitude of the second read current $I_{RD2}$ in the second bit line $BL_2$. For example, a current comparator is provided. The current comparator receives the first read current $I_{RD1}$ and the second read current $I_{RD2}$. If the magnitude of the first read current $I_{RD1}$ is higher than the magnitude of the second read current $I_{RD2}$, a first logic value (e.g., "0") is determined as the random code. Whereas, if the magnitude of the first read current $I_{RD1}$ is lower than the magnitude of the second read current $I_{RD2}$, a second logic value (e.g., "1") is determined as the random code.

In a variant example of the OTP memory cell of the seventh embodiment, each of the six transistors has the structure of the GAA transistor as shown in FIG. 1E. For succinctness, the detailed description is omitted herein. In the OTP memory cell of the eighth embodiment, each of the first select transistor $M_{GAA\_sel1}$, the second select transistor $M_{GAA\_sel2}$, the first following transistor $M_{GAA\_FL1}$, the second following transistor $M_{GAA\_FL2}$, the first antifuse transistor $M_{GAA\_AF1}$ and the second antifuse transistor $M_{GAA\_AF2}$ has four nanowires. It is noted that numerous modifications and alterations may be made while retaining the teachings of the invention. For example, in some other embodiments, the first select transistor $M_{GAA\_sel1}$ has X nanowires, the second select transistor $M_{GAA\_sel2}$ has Y nanowires, the first following transistor $M_{GAA\_FL1}$ has V nanowires, the second following transistor $M_{GAA\_FL2}$ has W nanowires, the first antifuse transistor $M_{GAA\_AF1}$ has P nanowires, and the second antifuse transistor $M_{GAA\_AF2}$ has Q nanowires.

For example, in a variant example of the OTP memory cell of the seventh embodiment, the first select transistor $M_{GAA\_sel1}$ has 1 nanowire (X=1), the second select transistor $M_{GAA\_sel2}$ has 1 nanowire (Y=1), the first following transistor $M_{GAA\_FL1}$ has 1 nanowire (V=1), the second following transistor $M_{GAA\_FL2}$ has 1 nanowire (W=1), the first antifuse transistor $M_{GAA\_AF1}$ has 1 nanowire (P=1), and the second antifuse transistor $M_{GAA\_AF2}$ has 1 nanowire (Q=1). Due to this structural design, the antifuse-type OTP memory cell for the PUF technology has the smallest size.

From the above descriptions, the present invention provides an OTP memory cell with gate-all-around (GAA) transistors for a physically unclonable function (PUF) technology. Each OTP memory cell can generate one bit of the random code. Moreover, plural OTP memory cells can be used to generate a unique identity code (ID code) of the semiconductor chip. For example, after 128 OTP memory cells are subjected to an enroll action and a read action sequentially, a 128-bit random code can be generated. By using the 128-bit random code, the data in the semiconductor chip can be effectively protected.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An antifuse-type one time programming (OTP) memory cell for a physically unclonable function technology, the antifuse-type OTP memory cell comprising:

a first nanowire;

a first gate structure comprising a first spacer, a second spacer, a first gate dielectric layer and a first gate layer, wherein a central region of the first nanowire is surrounded by the first gate dielectric layer, the first gate dielectric layer is surrounded by the first gate layer, the first gate layer is connected with an antifuse control line, a first side region of the first nanowire is surrounded by the first spacer, and a second side region of the first nanowire is surrounded by the second spacer;

a first drain/source structure electrically contacted with a first terminal of the first nanowire;

a second nanowire;

a second gate structure comprising a third spacer, a fourth spacer, a second gate dielectric layer and a second gate layer, wherein a central region of the second nanowire is surrounded by the second gate dielectric layer, the second gate dielectric layer is surrounded by the second gate layer, the second gate layer is connected with the antifuse control line, a first side region of the second nanowire is surrounded by the third spacer, and a second side region of the second nanowire is surrounded by the fourth spacer;

a second drain/source structure electrically contacted with a second terminal of the first nanowire and a first terminal of the second nanowire;

a third drain/source structure electrically contacted with a second terminal of the second nanowire;

a first select transistor comprising a first drain/source terminal, a gate terminal and a second drain/source terminal, wherein the second drain/source terminal of the first select transistor is connected with the first drain/source structure, the first drain/source terminal of the first select transistor is connected with a first bit line, and the gate terminal of the first select transistor is connected with a word line; and a second select transistor comprising a first drain/source terminal, a gate terminal and a second drain/source terminal, wherein the first drain/source terminal of the second select transistor is connected with the third drain/source structure, the gate terminal of the second select transistor is connected with the word line, and the second drain/source terminal of the second select transistor is connected with a second bit line.

2. The antifuse-type OTP memory cell as claimed in claim 1, wherein when an enroll action is performed, a first enroll path between the antifuse control line and the first bit line and a second enroll path between the antifuse control line and the second bit line are turned on, the antifuse control line receives an enroll voltage, the first bit line receives a ground voltage, and the second bit line receives the ground voltage, so that one of the first gate dielectric layer and the second gate dielectric layer is ruptured.

3. The antifuse-type OTP memory cell as claimed in claim 2, wherein when a read action is performed, a first read path between the antifuse control line and the first bit line and a second read path between the antifuse control line and the second bit line are turned on, the antifuse control line receives a read voltage, the first bit line receives the ground voltage, and the second bit line receives the ground voltage, so that the first bit line receives a first read current and the second bit line receives a second read current, wherein a one-bit random code is determined according to a magnitude of the first read current and a magnitude of the second read current.

4. The antifuse-type OTP memory cell as claimed in claim 1, wherein the first select transistor comprises:

a third nanowire, wherein a first terminal of the third nanowire is electrically contacted with the first drain/source structure;

a third gate structure comprising a fifth spacer, a sixth spacer, a third gate dielectric layer and a third gate layer, wherein a central region of the third nanowire is surrounded by the third gate dielectric layer, the third gate dielectric layer is surrounded by the third gate layer, the third gate layer is connected with the word line, a first side region of the third nanowire is surrounded by the fifth spacer, and a second side region of the third nanowire is surrounded by the sixth spacer; and a fourth drain/source structure electrically contacted with a second terminal of the third nanowire, wherein the fourth drain/source structure is connected with the first bit line.

5. The antifuse-type OTP memory cell as claimed in claim 4, wherein the second select transistor comprises:

a fourth nanowire, wherein a first terminal of the fourth nanowire is electrically contacted with the third drain/source structure;

a fourth gate structure comprising a seventh spacer, an eighth spacer, a fourth gate dielectric layer and a fourth gate layer, wherein a central region of the fourth nanowire is surrounded by the fourth gate dielectric layer, the fourth gate dielectric layer is surrounded by the fourth gate layer, the fourth gate layer is connected with the word line, a first side region of the fourth nanowire is surrounded by the seventh spacer, and a second side region of the fourth nanowire is surrounded by the eighth spacer; and a fifth drain/source structure electrically contacted with a second terminal of the fourth nanowire, wherein the fifth drain/source structure is connected with the second bit line.

6. An antifuse-type OTP memory cell for a physically unclonable function technology, the antifuse-type OTP memory cell comprising:

a first nanowire;

a first gate structure comprising a first spacer, a second spacer, a first gate dielectric layer and a first gate layer, wherein a central region of the first nanowire is surrounded by the first gate dielectric layer, the first gate dielectric layer is surrounded by the first gate layer, the first gate layer is connected with an antifuse control line, a first side region of the first nanowire is surrounded by the first spacer, and a second side region of the first nanowire is surrounded by the second spacer;

a first drain/source structure electrically contacted with a first terminal of the first nanowire;

a second nanowire;

a second gate structure comprising a third spacer, a fourth spacer, a second gate dielectric layer and a second gate layer, wherein a central region of the second nanowire is surrounded by the second gate dielectric layer, the second gate dielectric layer is surrounded by the second gate layer, the second gate layer is connected with the antifuse control line, a first side region of the second nanowire is surrounded by the third spacer, and a second side region of the second nanowire is surrounded by the fourth spacer;

a second drain/source structure electrically contacted with a second terminal of the first nanowire and a first terminal of the second nanowire;

a third drain/source structure electrically contacted with a second terminal of the second nanowire;

a first select transistor comprising a first drain/source terminal, a gate terminal and a second drain/source terminal, wherein the first drain/source terminal of the first select transistor is connected with a first bit line, and the gate terminal of the first select transistor is connected with a word line;

a first following transistor comprising a first drain/source terminal, a gate terminal and a second drain/source terminal, wherein the first drain/source terminal of the first following transistor is connected with the second drain/source terminal of the first select transistor, the gate terminal of the first following transistor is connected with a following control line, and the second drain/source terminal of the first following transistor is connected with the first drain/source structure;

a second following transistor comprising a first drain/source terminal, a gate terminal and a second drain/source terminal, wherein the first drain/source terminal of the second following transistor is connected with the third drain/source structure, and the gate terminal of the second following transistor is connected with the following control line; and, a second select transistor comprising a first drain/source terminal, a gate terminal and a second drain/source terminal, wherein the first drain/source terminal of the second select transistor is connected with the second drain/source terminal of the second following transistor, the gate terminal of the second select transistor is connected with the word line, and the second drain/source terminal of the second select transistor is connected with a second bit line.

7. The antifuse-type OTP memory cell as claimed in claim 6, wherein when an enroll action is performed, a first enroll path between the antifuse control line and the first bit line and a second enroll path between the antifuse control line and the second bit line are turned on, the antifuse control line receives an enroll voltage, the first bit line receives a ground voltage, and the second bit line receives the ground voltage, so that one of the first gate dielectric layer and the second gate dielectric layer is ruptured.

8. The antifuse-type OTP memory cell as claimed in claim 7, wherein when a read action is performed, a first read path between the antifuse control line and the first bit line and a second read path between the antifuse control line and the second bit line are turned on, the antifuse control line receives a read voltage, the first bit line receives the ground voltage, and the second bit line receives the ground voltage, so that the first bit line receives a first read current and the second bit line receives a second read current, wherein a one-bit random code is determined according to a magnitude of the first read current and a magnitude of the second read current.

9. The antifuse-type OTP memory cell as claimed in claim 6, wherein the first following transistor comprises:

a third nanowire, wherein a first terminal of the third nanowire is electrically contacted with the first drain/source structure;

a third gate structure comprising a fifth spacer, a sixth spacer, a third gate dielectric layer and a third gate layer, wherein a central region of the third nanowire is surrounded by the third gate dielectric layer, the third gate dielectric layer is surrounded by the third gate layer, the third gate layer is connected with the following control line, a first side region of the third nanowire is surrounded by the fifth spacer, and a second side region of the third nanowire is surrounded by the sixth spacer; and a fourth drain/source structure electrically contacted with a second terminal of the third nanowire.

10. The antifuse-type OTP memory cell as claimed in claim 9, wherein the first select transistor comprises:

a fourth nanowire, wherein a first terminal of the third nanowire is electrically contacted with the fourth drain/source structure;

a fourth gate structure comprising a seventh spacer, an eighth spacer, a fourth gate dielectric layer and a fourth gate layer, wherein a central region of the fourth nanowire is surrounded by the fourth gate dielectric layer, the fourth gate dielectric layer is surrounded by the fourth gate layer, the fourth gate layer is connected with the word line, a first side region of the fourth nanowire is surrounded by the seventh spacer, and a second side region of the fourth nanowire is surrounded by the eighth spacer; and a fifth drain/source structure electrically contacted with a second terminal of the fourth nanowire, wherein the fifth drain/source structure is connected with the first bit line.

11. The antifuse-type OTP memory cell as claimed in claim 10, wherein the second following transistor comprises:

a fifth nanowire, wherein a first terminal of the fifth nanowire is electrically contacted with the third drain/source structure;

a fifth gate structure comprising a ninth spacer, a tenth spacer, a fifth gate dielectric layer and a fifth gate layer, wherein a central region of the fifth nanowire is surrounded by the fifth gate dielectric layer, the fifth gate dielectric layer is surrounded by the fifth gate layer, the fifth gate layer is connected with the following control line, a first side region of the fifth nanowire is surrounded by the ninth spacer, and a second side region of the fifth nanowire is surrounded by the tenth spacer; and a sixth drain/source structure electrically contacted with a second terminal of the fifth nanowire.

12. The antifuse-type OTP memory cell as claimed in claim 11, wherein the second select transistor comprises:

a sixth nanowire, wherein a first terminal of the sixth nanowire is electrically contacted with the sixth drain/source structure;

a sixth gate structure comprising an eleventh spacer, a twelfth spacer, a six gate dielectric layer and a sixth gate layer, wherein a central region of the sixth nanowire is surrounded by the sixth gate dielectric layer, the sixth nanowire is surrounded by the sixth gate layer, the sixth gate layer is connected with the word line, a first side region of the sixth nanowire is surrounded by the eleventh spacer, and a second side region of the sixth nanowire is surrounded by the twelfth spacer; and a seventh drain/source structure electrically contacted with a second terminal of the sixth nanowire, wherein the seventh drain/source structure is connected with the second bit line.

* * * * *